(12) United States Patent
Pal et al.

(10) Patent No.: US 8,640,068 B2
(45) Date of Patent: Jan. 28, 2014

(54) METHODS AND SYSTEMS CONFIGURED TO COMPUTE A GUARD ZONE OF A THREE-DIMENSIONAL OBJECT

(75) Inventors: Rajat Kumar Pal, Kolkata (IN); Ranjan Mehera, Kolkata (IN)

(73) Assignee: University of Calcutta, Kolkata, West Bengal (IN)

( * ) Notice: Subject to any disclaimer, the term of this patent is extended or adjusted under 35 U.S.C. 154(b) by 0 days.

(21) Appl. No.: 13/497,477

(22) PCT Filed: Mar. 3, 2011

(86) PCT No.: PCT/IB2011/000452
§ 371 (c)(1),
(2), (4) Date: Mar. 21, 2012

(87) PCT Pub. No.: WO2012/093275
PCT Pub. Date: Jul. 12, 2012

(65) Prior Publication Data
US 2012/0278782 A1    Nov. 1, 2012

(30) Foreign Application Priority Data
Jan. 7, 2011  (IN) ................................ 19/KOL/2011

(51) Int. Cl.
*G06F 17/50* (2006.01)
(52) U.S. Cl.
USPC .......................................... 716/110; 716/115
(58) Field of Classification Search
USPC ................................................ 716/110–115
See application file for complete search history.

(56) References Cited

U.S. PATENT DOCUMENTS

| 4,441,931 A | 4/1984 | Levin |
| 5,550,750 A | 8/1996 | Wolff |
| 5,737,233 A | 4/1998 | Rao |
| 6,051,031 A | 4/2000 | Shubat et al. |
| 6,816,170 B1 | 11/2004 | Udeshi |
| 8,108,802 B2 * | 1/2012 | Rosenbluth et al. ............ 716/50 |

OTHER PUBLICATIONS

Mehera et. al. "A Time-Optimal Algorithm for Guard Zone Problem" 2007, IEEE p. 1-4.*
de Berg et al., Computational Geometry: Algorithms and Applications, (Third Edition), Springer-Verlag, Berlin, 2008, Chapter 11: Convex Hulls, pp. 243-258.

(Continued)

Primary Examiner — Binh Tat
(74) Attorney, Agent, or Firm — Moritt Hock & Hamroff LLP; Steven S. Rubin, Esq.

(57) ABSTRACT

Techniques generally disclosed herein relate to computation of a guard zone of a three-dimensional object. In some examples, guard zones may be computed by identifying intersection lines that couple adjacent planes of an object, and categorizing an external angle at an intersection line between adjacent planes as concave or convex. In some embodiments, for convex angles, a cylindrical surface can be determined that is located about an outside surface of the object and centered along the intersection line between the adjacent planes. In some embodiments, for concave angles, the external angle can be bisected with a bisection plane. A guard zone may be formed by one or more of (i) providing a guard zone plane parallel to the object that is a tangent to a given cylindrical surface, (ii) providing a guard zone plane parallel to the object that intersects a given bisection plane, and/or (iii) coupling adjacent guard zone planes.

19 Claims, 14 Drawing Sheets

(56) References Cited

OTHER PUBLICATIONS de Berg et al., Computational Geometry: Algorithms and Applications, (Third Edition), Springer-Verlag, Berlin, 2008, Chapter 13: Robotic Motion Planning, Section 13.3: Minkowsi Sums, pp. 290-297.

Pottman et al., Computational Line Geometry, Springer-Verlag, Berlin, 2001, Chapter 6: Developable Surfaces, Section 6.3: Developable Surfaces of Constant Slope and Applications, Subsection 6.3.2.: The Cyclographical Mapping and Its Applications, Subheading: Disk Bezier Curves (Definition of Minkowski) p. 374.

Sherwani, Algorithms for VLSI Physical Design Automation, Kluwer Academic, Boston, 1993, Chapter 2: Design and Fabrication of VLSI Devices, pp. 29-62.

Sherwani, Algorithms for VLSI Physical Design Automation, Kluwer Academic, Boston, 1993, Chapter 12: Physical Design Automation of MCMs, pp. 429-449.

Aki, Parallel Computation: Models and Methods, Prentice Hall, Upper Saddle River, New Jersey, 1997, Section 1.4.3: Analysis of Parallel Algorithms, pp. 21-25.

Aki, Parallel Computation: Models and Methods, Prentice Hall, Upper Saddle River, New Jersey, 1997, Section 2.2 of Chapter 2, The Parallel Random Access Machine, pp. 39-50.

Hwang, Advanced Computer Architecture: Parallelism, Scalability, Programmability, McGraw Hill, New York, 1993, Chapter 1: Parallel Computer Models, pp. 1-50.

Pal, Multi-Layer Channel Routing: Complexity and Algorithms, Sep. 2000, Chapter 10, Section 10.3.3: Performance Driven Channel Routing, pp. 346-347 and Section 10.3.4: Routing for Multi-Chip Modules, p. 347.

Hennessy et al., Computer Architecture: A Quantitative Approach (Fourth Edition), Morgan Kaufman, 2007, Chapter 1: Fundamentals of Computer Design, pp. 1-54.

Quinn, Parallel Computing: Theory and Practice (Second Edition), McGraw-Hill, New York, 1994, Chapter 2, Section 2.2: The PRAM Model for Parallel Computation, pp. 27-30 and Section 2.4: Reducing the Number of Processors, pp. 43-46.

Quinn, Parallel Computing: Theory and Practice (Second Edition), McGraw-Hill, New York, 1994, Chapter 3, Section 3.5: Flynn's Taxonomy, pp. 78-80.

International Search Report and Written Opinion issued by the Australian Patent Office in PCT/IB2011/000452, dated Jun. 7, 2011.

Nandy et al., "Safety Zone Problem", Journal of Algorithms 37, pp. 538-569 (2000).

Sachdev et al., "3D Spatial Layouts Using A-Teams", Proceedings of DETC'98, 1998 ASME Design Engineering Technical Conferences, Sep. 13-16, 1998, Atlanta, Georgia, pp. 1-11.

Lee et al., "Polynomial/Rational Approximation of Minkowski Sum Boundary Curves", Graphical Models and Image Processing, vol. 60, No. 2, Mar. 1998, pp. 136-165.

Chazelle, Triangulating a Simple Polygon in Linear Time, Discrete Computational Geometry, vol. 6, 1991.

Bajaj et al., "Generation of Configuration Space Obstacles: The Case of Moving Algebraic Curves", Algorithmica, vol. 4, No. 2, 1989.

Ramkumar, "An Algorithm to Compute the Minkowski Sum Outer-Face of Two Simple Polygons", Proc. of the 12th Annual ACM Symposium on Computational Geometry, pp. 234-241, 1996.

Mehera et al., "A Cost-Optimal Algorithm for Guard Zone Problem", Proc. of 10th Int'l Conference on Distributed Computing and Networking (ICDCN 2009), Hyderabad, India, Jan. 3-6, 2009.

Mehera et al., "A Time-Optimal Algorithm for Guard Zone Problem", Proc. of 22nd IEEE Region 10 International Conference on Intelligent Information Communication Technologies for Better Human Life (IEEE Tencon 2007) Taipei, Taiwan, Oct. 30-Nov. 2, 2007.

Balakrishnan et al., "Wire Congestion and Thermal Aware 3D Global Placement", Proceedings of the 2005 Asia and South Pacific Design Automation Conference.

Pal et al., "Yet Another Linear Time Algorithm for Guard Zone Problem", The Icfai Journal of Computer Sciences, vol. II, No. 3, 2003.

Hernandez-Barrera, A., "Computing the Minkowski Sum of Monotone Polygons," IEICE Trans. on Information Systems, 1997, pp. 218-222, vol. E80-D, No. 2.

* cited by examiner

| Intersection Line | Plane Identifier 1 | Plane Identifier 2 | Meta Data (Angle Information) |
|---|---|---|---|
| AB | P1 | P3 | Convex |
| AD | P1 | P2 | Convex |
| AF | P2 | P3 | Convex |
| BC | P1 | P4 | Convex |
| BG | P3 | P4 | Convex |
| CD | P1 | P5 | Convex |
| CH | P4 | P5 | Convex |
| DE | P2 | P5 | Convex |
| EF | P2 | P6 | Convex |
| EH | P5 | P6 | Convex |
| FG | P3 | P6 | Convex |
| GH | P4 | P6 | Convex |

1800 A Computer Program Product

1802 A Signal Bearing Medium

1804 Programming Instructions

- identifying intersection lines that couple adjacent planes associated with the object;
- categorizing an external angle at an intersection line between adjacent planes as either concave or convex;
- when the external angle is categorized as convex, determining a cylindrical surface about an outside surface of the object, wherein the cylindrical surface is positioned at a location with a radius $r$ centered along the intersection line between the adjacent planes;
- when the external angle is categorized as concave, determining a bisection of the external angle with a bisection plane; and
- determining a three-dimensional guard zone associated with the object by one or more of providing a first guard zone plane parallel to the object and at the distance $r$ from the object that is a tangent to a given cylindrical surface, providing a second guard zone plane parallel to the object and at the distance $r$ from the object that intersects a given bisection plane, and/or coupling adjacent guard zone planes.

| 1806 A Computer Readable Medium | 1808 A Computer Recordable Medium | 1810 A Communications Medium |

FIGURE 18

METHODS AND SYSTEMS CONFIGURED TO COMPUTE A GUARD ZONE OF A THREE-DIMENSIONAL OBJECT

REFERENCE TO RELATED APPLICATION

The present application claims priority to a corresponding patent application filed in India and having application number 19/KOL/2011, filed on Jan. 7, 2011, the entire contents of which are herein incorporated by reference. The present application is a U.S. National Phase Application pursuant to 35 U.S.C. 371 of International Application No. PCT/IB2011/000452, filed on Mar. 3, 2011, the entire contents of which are herein incorporated by reference.

BACKGROUND

Unless otherwise indicated herein, the approaches described in this section are not prior art to the claims in this application and are not admitted to be prior art by inclusion in this section.

Design of very large scale integration (VLSI) circuits can be an error prone, time consuming, and tedious task. To facilitate design of three-dimensional (3D) integrated circuits, pre-designed sub-circuits or modules may be used. In block level circuit design, placement of the modules takes into consideration performance factors, such as electrical hazards (or crosstalk), creation of heat, and delays in propagating signals, for example. To minimize such operational risks, modules may be placed at safe distances from each other that may vary due to the desired performance factor. At the same time, modules may be placed in close proximity so that an overall amount of space required realizing the VLSI circuitry is optimized. Blocks may also be placed in close proximity to minimize wiring required to connect blocks.

A demand of decreasing feature size (e.g., from micro to nanometers) and increasing chip dimension (e.g., incorporating millions of transistors) has resulted in changes of technology from 2D to 3D, and challenges in designing VLSI circuits have increased due to increased interconnect delays and high power budgets in designs, for example. Challenges are multidimensional, ranging from factors such as area or space minimization and layers of interconnect minimization in 3D design to several performance requirements such as signal interference involving 3D parasitics, signal propagation delays, and thermal hazards, for example.

SUMMARY

Disclosed are techniques generally related to the computation of a guard zone associated with a three-dimensional object. In some examples of the present disclosure, a computer readable storage medium having stored therein instructions executable by a computing device to cause the computing device to determine one or more three-dimensional guard zones associated with a corresponding object is provided. The instructions may be effective to cause the computing device to perform the functions that may include identifying intersection lines that couple adjacent planes associated with the object, and categorizing an external angle at an intersection line between adjacent planes as either concave or convex. In some examples, when the external angle is categorized as convex, the functions may include determining a cylindrical surface about an outside surface of the object and the cylindrical surface may be positioned at a location with a radius r centered along the intersection line between the adjacent planes. In some examples, when the external angle is categorized as concave, the functions may include determining a bisection of the external angle with a bisection plane. In addition, the functions may include determining a three-dimensional guard zone of the object by one or more of providing a first guard zone plane parallel to the object and at the distance r from the object that is a tangent to a given cylindrical surface, providing a second guard zone plane parallel to the object and at the distance r from the object that intersects a given bisection plane, and/or coupling adjacent guard zone planes.

Additional examples may include a system configured to compute one or more three-dimensional guard zones associated with a corresponding object. The system comprises memory, a plurality of processors, and an output processor. The memory may be configured to store information associated with an object including coordinates of lines and planes associated with the object, and a number of consecutive lines may form a plane associated with the object. Each of the plurality of processors may be configured to receive from the memory respective information associated with adjacent planes and a line between the adjacent planes, and each of the plurality of processors may be configured to receive information associated with a different pair of adjacent planes and line. Each of the plurality of processors may be configured to compute an external angle created at the line between the adjacent planes and based on the external angle to determine a guard zone component for the line between the adjacent planes. The output processor may be configured to receive information associated with the guard zone component from each of the plurality of processors, and to determine a three-dimensional guard zone associated with the object by combining information associated with the guard zone component from each of the plurality of processors.

Further examples may include a method to compute guard zones associated with one or more objects. The method may comprise storing in memory information associated with an object including coordinates of lines and planes comprising the object and a number of consecutive lines form a plane of the object. The method may also comprise receiving at each of a plurality of processors from the memory information associated with respective adjacent planes and a line between the adjacent planes, and each of the plurality of processors may be configured to receive information associated with a different pair of adjacent planes and line. The method may further comprise each of the plurality of processors computing an external angle created at the line between the adjacent planes, and based on the external angle, each of the plurality of processors determining a guard zone component for the line between the adjacent planes. The method may also comprise determining a guard zone for the object by combining information associated with the guard zone component from each of the plurality of processors. The method may further comprise determining a second three-dimensional guard zone for a second object, identifying notches in the object and/or the second object, and determining an arrangement of the object and the second object such that each of the object and the second object is at a minimum separation distance between each other using one or more of the three-dimensional guard zone, the second three-dimensional guard zone, and the notches in the object and/or the second object.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the drawings:

FIG. 18 is a schematic illustrating a conceptual partial view of an example computer program product that includes a computer program for executing a computer process on a computing device, All arranged in accordance with at least some embodiments described herein.

DETAILED DESCRIPTION

Figure 1:
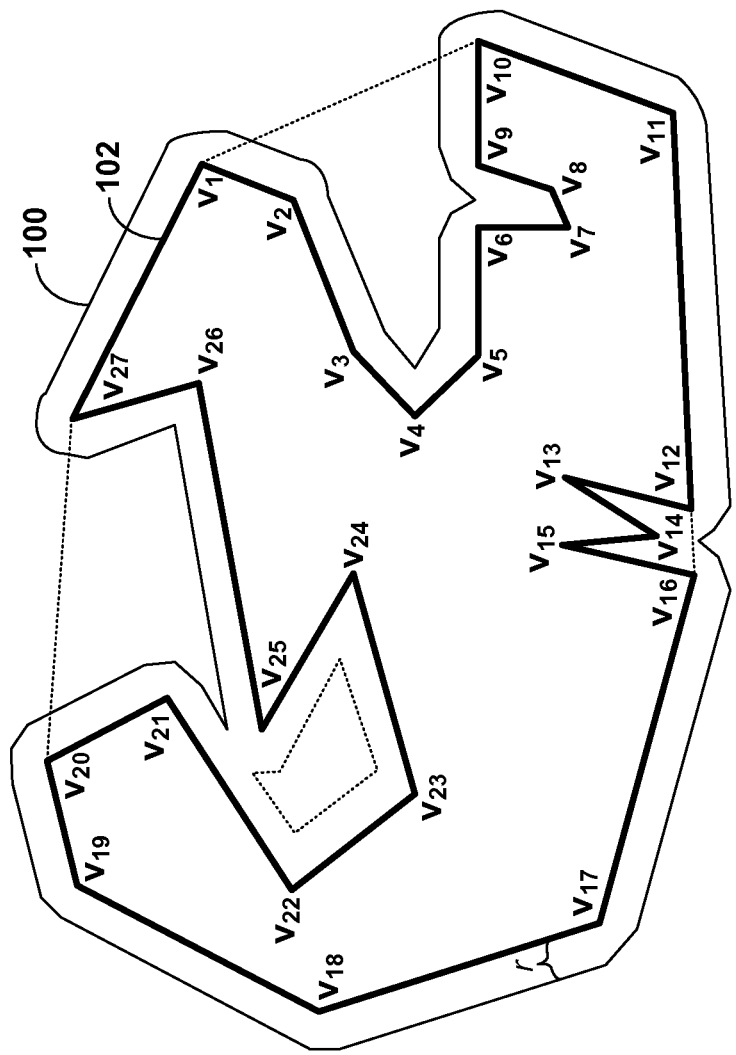
FIG. 1 illustrates an example guard zone of an example two-dimensional (2D) object 102.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

This disclosure is drawn, inter alia, to methods, devices, and systems related to computing a three-dimensional (3D) guard zone for a 3D object. Briefly stated, techniques generally disclosed herein relate to computation of a guard zone of a three-dimensional object. In some examples, guard zones may be computed by identifying intersection lines that couple adjacent planes of an object, and categorizing an external angle at an intersection line between adjacent planes as concave or convex. In some embodiments, for convex angles, a cylindrical surface can be determined that is located about an outside surface of the object and centered along the intersection line between the adjacent planes. In some embodiments, for concave angles, the external angle can be bisected with a bisection plane. A guard zone may be formed by one or more of (i) providing a guard zone plane parallel to the object that is a tangent to a given cylindrical surface, (ii) providing a guard zone plane parallel to the object that intersects a given bisection plane, and/or (iii) coupling adjacent guard zone planes. Example embodiments described herein may be used separately, or in some instances, may be combined (or portions may be combined).

FIG. 1 illustrates an example guard zone 100 of an example two-dimensional (2D) object 102. The 2D object 102 is shown with vertices labeled clockwise as $v_1$ to $v_{27}$. Of course, however, an object having a different shape may have more or fewer vertices. The guard zone 100 is illustrated in the domain of (2D) computational geometry. However, a 2D polygon may be a cross-section of a 3D object, and thus, the guard zone 100 may be a cross-section of a 3D guard zone, for example.

For a 3D object, guard zone computation may be defined as given a 3D object S (an object that is available in reality), a guard zone G (of width r) is a closed (3D) space comprising planes, lines, spherical, and cylindrical surfaces (of radius r) bounding the object S such that there exists no pair of points p (on a boundary of S) and q (on a boundary of G) that have a Euclidean distance d(p,q) less than r. As shown in FIG. 1, no points on a boundary of the 2D object 102 have a distance to a boundary of the guard zone 100 less than a predefined distance r. The boundary of the guard zone 100 describes a region in the sense that no two edges (straight-line segments) and/or circular surface(s)) on a boundary of the guard zone 100 intersect in (or pass through) an interior of the guard zone 100.

Figure 2:
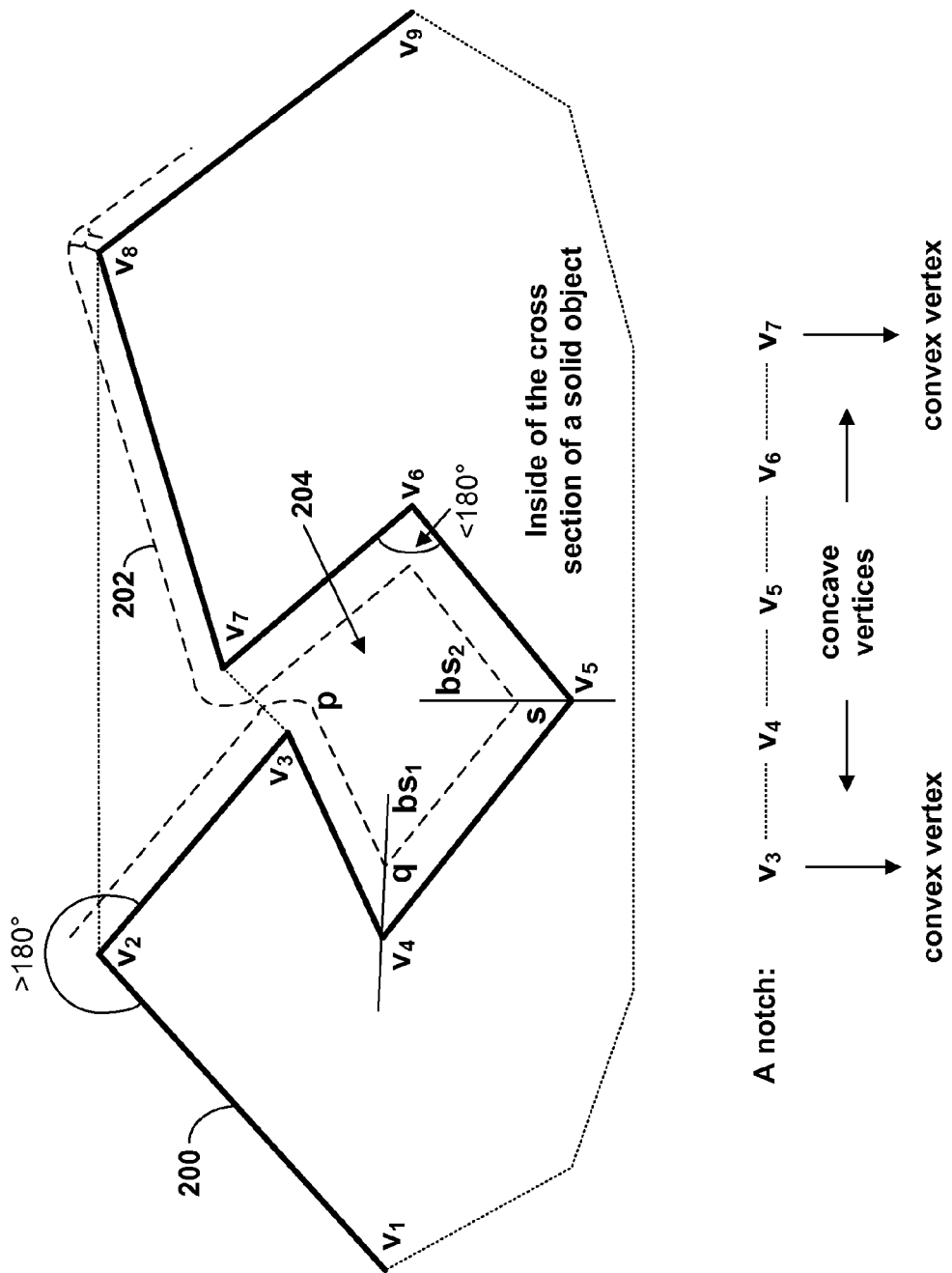
FIG. 2 illustrates a portion of a cross section of a 3D object, and a portion of a guard zone computed around the 3D object.

FIG. 2 illustrates a portion of a cross-section of a 3D object 200, and a portion of a guard zone 202 computed around the 3D object 200, arranged in accordance with at least some embodiments described herein. In FIG. 2, all vertices (e.g., labeled as $v_1$ to $v_9$ from left to right) may be categorized as convex vertices or concave vertices. An object may contain both convex vertices and concave vertices, and several planes of the object may intersect at a vertex. At each vertex of a solid object, at least three planes may intersect. Four or more planes may also intersect at a vertex of a solid object, for example.

A concave vertex (or point) is a vertex at which the 3D object 200 curves inward. A vertex v of a solid object S is defined as concave if an angle between each pair of adjacent planes that join at vertex v (in the 2D view) outside the object (i.e., an external angle at vertex v) is less than 180°. For example, for the 2D cross-section of the 3D object 200, a line connecting vertices $v_6$ and $v_7$ intersects a line connecting vertices $v_5$ and $v_6$, and an angle between the intersecting lines outside the 3D object 200 is shown to be less than 180°. Thus, vertex $v_6$ is defined as a concave vertex. Note that in a 3D object 200, vertex $v_6$ may be a point on the intersection line between its adjacent planes, rather than a vertex of the 3D object 200. Similarly, vertices $v_4$ and $v_5$ are concave vertices, for example.

A convex vertex (or point) is a vertex at which the 3D object 200 curves outward. In two dimensions, a vertex v of a solid object S is defined as convex if an angle between a pair of adjacent planes that join at vertex v outside the object (i.e., an external angle at vertex v) is greater than 180°. For example, for the 2D cross-section of the 3D object 200, a line connecting vertices $v_1$ and $v_2$ intersects a line connecting vertices $v_2$ and $v_3$, and an angle between the intersecting lines outside the 3D object 200 is shown to be greater than 180°. Thus, vertex $v_2$ is defined as a convex vertex. Note that in a 3D object 200, vertex $v_2$ may be a point on the intersection line between its adjacent planes, rather than a vertex of the 3D object 200. Similarly, vertices $v_3$, $v_7$, and $v_8$ are concave vertices, for example.

At a concave vertex, each pair of adjacent planes of the 3D object 200 intersect and form an external angle (along an intersection line) less than 180°. At a convex vertex, at least one pair of adjacent planes of the 3D object 200 intersect and form an external angle (along an intersection line) greater than 180°.

Figure 3:
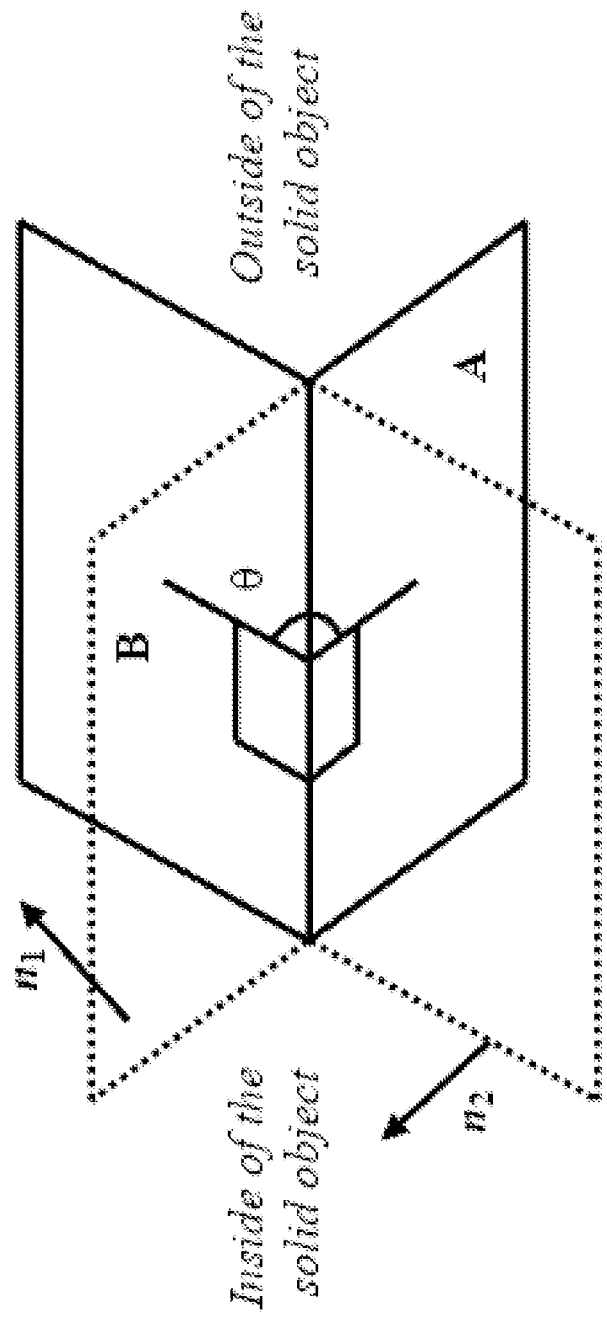
FIG. 3 illustrates a portion of a 3D object where two adjacent planes A and B intersect, and a concave (external) angle θ is formed between the intersecting planes.

FIG. 3 illustrates a portion of a 3D object where two adjacent planes A and B intersect, and a concave (external) angle θ is formed between the intersecting planes. Dotted lines indicate an imaginary portion of the planes A and B (inside the solid object). To determine whether an angle θ between adjacent planes A and B outside the object is convex or concave, normal vectors may be considered. For example, a normal vector for plane A is $n_1$ and a normal vector for plane B is $n_2$. An angle between planes A and B is the same as an angle between the normal vectors $n_1$ and $n_2$ to planes A and B. Thus, the angle θ between planes A and B can be determined as $$\theta = \cos^{-1}\left(\frac{|n_1 \cdot n_2|}{|n_1||n_2|}\right) \quad \text{Equation (1)}$$

In this way, external angles of the object can be computed (as concave or convex) in a time O(l) (e.g., an asymptotic upper bound), where l is a number of intersection lines between adjacent planes of the object, for example.

In some example, concave and convex angles can be defined relative to a surface normal using Equation (1). A concave or convex angle may be relative to an external surface of the 3D object, for example.

Referring back to FIG. 2, the guard zone 202 of the 3D object 200 can be determined by categorizing vertices as either convex or concave. To categorize vertices, intersection lines created due to intersection of adjacent planes of the 3D object 200 are labeled as $l_1, l_2, \ldots, l_l$. Intersection lines may be lines connecting adjacent vertices, such as a line connecting vertices $v_2$ and $v_3$, if $v_2$ and $v_3$ are vertices of the 3D object 200.

For each intersection line (where two adjacent planes of the object intersect), angles external to the 3D object 200 can be determined using Equation (1) above. If the angle is greater than 180°, then the vertex (and thus intersection line) can be considered convex, and in the 2D cross-sectional view, a circular arc, which is a cylindrical surface of radius r can be identified along the intersection line outside the 3D object 200 to determine a guard zone. This is shown in FIG. 2, for example, at vertex $v_8$. In the 3D view, a cylindrical surface of radius r can be drawn along the intersection line outside the 3D object 200 to determine the guard zone.

Otherwise, if the angle is less than 180° (as determined using Equation (1) above), then the vertex (and thus the intersection line) can be considered concave, and the external angle is bisected along the intersection line. Lines of bisection (e.g., $bs_1$ and $bs_2$) are shown in FIG. 2 at vertices $v_4$ and $v_5$. In the 2D cross-sectional view, to determine the guard zone, a line is then drawn parallel to the line $(l_i, l_{i+1})$, $1 \leq i < l$, at a distance r outside the 3D object 200. In the 3D view, a plane is then drawn parallel to the plane $(l_i, l_{i+1})$, $1 \leq i < l$, at a distance r outside the 3D object 200. For example, for intersection lines $l_{34}$ (e.g., line connecting vertices $v_3$ and $v_4$) and $l_{45}$ (e.g., line connecting vertices $v_4$ and $v_5$), bisection line $bs_1$ is drawn at vertex $v_4$. Then a plane is drawn parallel to the plane connecting vertices $v_3$ and $v_4$ resulting in plane pq. Plane pq can be considered a portion of the guard zone 202, for example.

Figure 4:
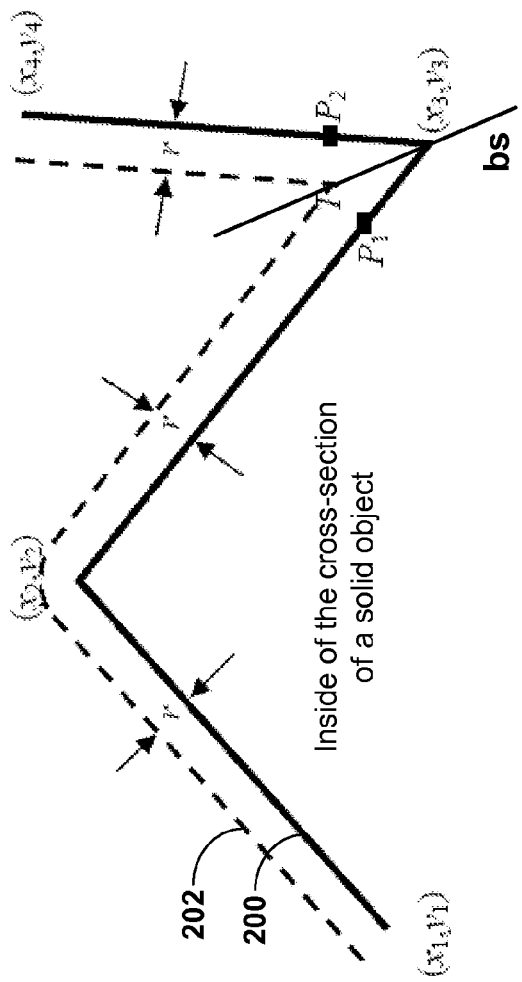
FIG. 4 illustrates a portion of a cross section of the 3D object and a portion of the guard zone.

FIG. 4 illustrates a portion of a cross-section of the 3D object 200 and a portion of the guard zone 202. Vertices have been relabeled $(x_1,y_1)$, $(x_2,y_2)$, $(x_3,y_3)$, and $(x_4,y_4)$ representing x and y coordinates of the 2D cross-section, for example. Vertex $(x_3,y_3)$ is a concave vertex, and thus a bisection line (bs) can be drawn bisecting an angle formed at the vertex $(x_3,y_3)$. The bisection line (bs) may be drawn such that a distance from points $P_1$ to T equals (or substantially equals) a distance from points $P_2$ to T, which is equal to a guard zone distance r.

Using these steps of determining whether a vertex is convex or concave and then drawing either a cylindrical surface or plane as described above, the guard zone 202 can be determined and formed by connecting each adjacent cylindrical surface and plane to each other, for example. For 2D objects, the arcs and lines can be coupled together to determine the guard zone, and a 2D object may be considered to be a cross-section of a 3D object. Thus, for 3D objects, line segments can be replaced with planes (e.g., surfaces), and circular arcs (of radius r) drawn at a polygonal vertex for 2D objects can be replaced with a cylindrical or spherical surfaces of radius r, for example.

Examples are described below to compute the guard zone 202 as shown in FIG. 2. Consider edge $v_2v_3$ in FIG. 2. Here, both vertices $v_2$ and $v_3$ are convex. A plane parallel to $v_2v_3$ with a length the same as $v_2v_3$ is drawn at a distance r away from a polygonal edge of the 3D object 200 with a cylindrical or spherical surface of radius r centered at vertex $v_2$ (in FIG. 2, lines and circular arcs are illustrated representing a 2D cross-section of the planes and surfaces). The plane parallel to $v_2v_3$ is a tangent to the cylindrical surface (of radius r) centered at $v_2$.

As another example, consider edge $v_3v_4$. Here, vertex $v_3$ can be considered a convex vertex and vertex $v_4$ can be considered as a concave vertex. A length of a plane of the guard zone 202 parallel to $v_3v_4$ is less than that of the plane $v_3v_4$ due to the concave vertex $v_4$. Here, also a plane $v_3v_4$ of the guard zone 202 touches (as a tangent) a cylindrical surface centered at $v_3$ at point p in FIG. 2, and on the other end (near $v_4$, which is a concave vertex) the plane of the guard zone 202 is prolonged up to point q, as stated below. Point q is an intersection point of the bisection plane $bs_1$, which is drawn at an angle between planes $v_3v_4$ and $v_4v_5$ (i.e., an angle at vertex $v_4$).

Consider edge $v_4v_5$ in FIG. 2, where both vertices $v_4$ and $v_5$ are determined to be concave vertices. No cylindrical surface is required for this portion of the guard zone 202. A plane $v_4v_5$ of the guard zone 202 can be obtained by determining a plane from point q to point s, where s is point at a plane bisecting vertex $v_5$ (e.g., at bisection $bs_2$). A length of the guard zone 202 plane $v_4v_5$ is less than that of the 3D object 200 plane $v_4v_5$.

Figure 5:
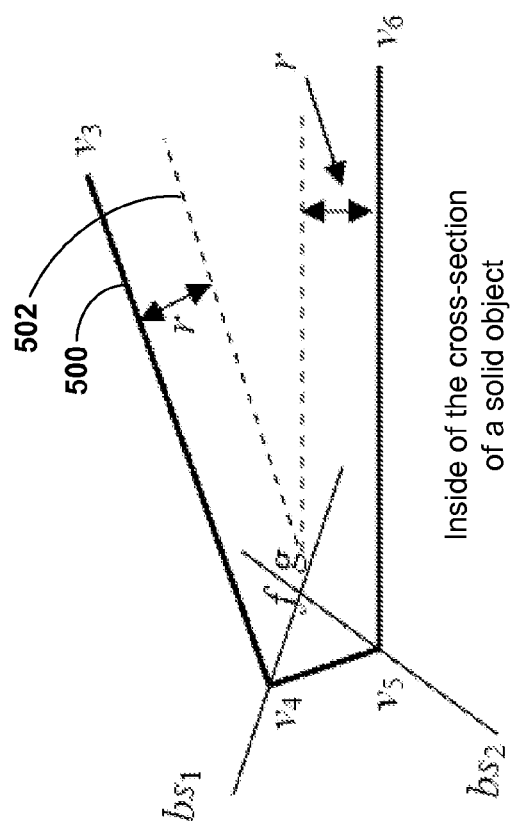
FIG. 5 illustrates an example portion of a cross section of a 3D object and a portion of a guard zone.

FIG. 5 illustrates an example portion of a cross-section of a 3D object 500 and a portion of a guard zone 502. In this example, a length of plane $v_4v_5$ of the 3D object 500 and external angles at vertices $v_4$ and $v_5$ are magnitudes such that a distance between an intersection point f of bisection planes $bs_1$ and $bs_2$ is less than a distance between an intersection point g of two planes of the guard zone 502 parallel to planes $v_3v_4$ and $v_5v_6$. In this case, there is no plane of the guard zone 502 that is determined to be parallel to plane $v_4v_5$. In general, instead of a single edge like $v_4v_5$, several edges or several notches of a polygon may be present for which no portion of a guard zone is distinguishingly computed, for example.

Figure 6:
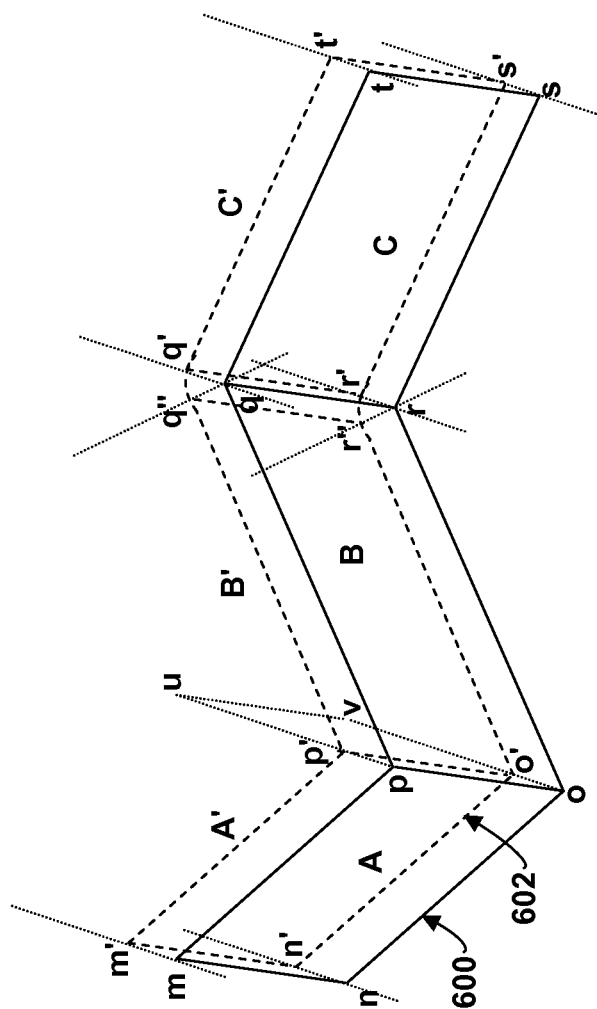
FIG. 6 illustrates an example portion of a 3D object (shown with solid lines) and a portion of a guard zone (shown with dotted lines)
Figure 7:
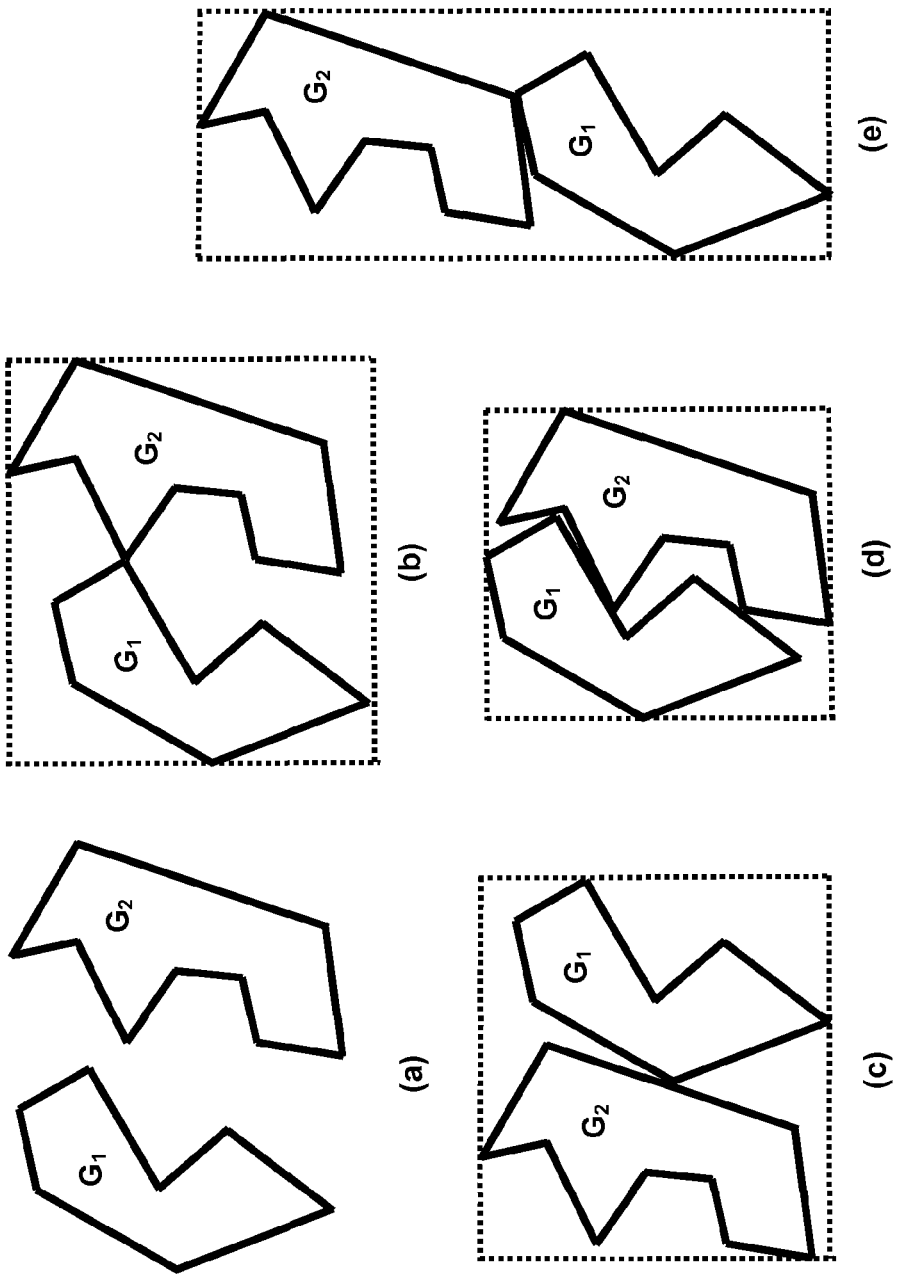
FIGS. 7a-e illustrate 2D views of example guard zones $G_1$ and $G_2$ of solid objects that each contain notches.

FIG. 6 illustrates an example portion of a 3D object 600 (shown with solid lines) and a portion of a guard zone 602 (shown with dotted lines). The illustration in FIG. 6 is in three-dimensions. The 3D object 600 includes three successive planes A, B, and C. For example, points (m-n-o-p) determine plane A, points (o-p-q-r) determine plane B, and points (q-r-s-t) determine plane C. Planes of the guard zone include planes A', B', and C'. Points (m'-n'-o'-p') determine plane A', points (o'-p'-q"-r") determine plane B', and points (q'-r'-s'-t') determine plane C'.

To compute the guard zone, because planes A and B form a concave angle along an intersection line o-p, the external angle between planes A and B can be bisected with a plane. The bisectional plane is shown as points (o-p-u-v). Plane A' can then be determined (with points (m'-n'-o'-p')) from a beginning plane (not shown) to the bisectional plane.

Planes B and C form a convex angle along an intersection line q-r, and thus, to compute the guard zone a cylindrical surface q'-r'-r"-q" can be computed centering the intersection line q-r (with a given radius value, for example) that joins planes B and C to form an external convex angle along the intersection line q-r. Note that a minimum distance from each point of A-B-C of the solid object to each point of their guard zone planes A'-B'-C' may be given as the radius value. The radius value may be maintained while computing the guard zone outside the solid object. Alternatively, the radius value may be adjusted for each portion of the guard zone, for example. The radius value can vary based on an application, and example values may be in the range of nanometers, for example.

When considering portions of an object with concave external angles, notches may be present in the object and can be considered when computing a guard zone. A notch 204 is formed outside the polygon, as shown in FIG. 2, below the dotted line connecting vertices $v_3$ and $v_7$, for example. A notch may be defined using false hull edges, hull edges, convex hull, and convex sets of an object, for example.

An object may be considered convex if for every pair of points within the object, every point on a straight line segment that joins any pair of points is also within the object, and thus, all points comprise a convex set, for example. A convex hull is a boundary formed by a convex set of points, and is represented by a sequence of vertices of line segments forming a boundary of the polygon. Thus, a convex hull is a convex polygon (having no concave external angle) of minimum area with all points residing on the boundary or inside the polygon for a given set of arbitrary points on a plane. A false hull edge is a hull edge introduced when obtaining a convex hull. For example, referring to FIG. 1, there are false hull edges drawn by dotted lines between vertices $v_1$ and $v_{10}$, $v_{12}$ and $v_{16}$, and $v_{20}$ and $v_{27}$. Similarly, referring to FIG. 2, a false hull edge is drawn by a dotted line between vertices $v_2$ and $v_8$.

Often a notch may be considered a polygonal region outside an object P that is formed with a chain of edges of P initiating and terminating at two vertices of a false hull edge. If P is a polygon and CH(P) denotes a convex hull of the polygon P, then a difference in the area of CH(P) and P comprises a number of disjoint notches outside polygon P. In this example, a notch is formed outside the polygon as shown in FIG. 2, below the dotted line connected vertices $v_2$ and $v_8$. Or, for example, notches may be formed outside the polygon as shown in FIG. 1, below the dotted line connecting vertices $v_1$ and $v_{10}$, $v_{12}$ and $v_{16}$, and $v_{20}$ and $v_{27}$.

Here a notch is considered a polygonal region outside the polygon that starts and ends with two consecutive convex vertices of the polygon that are not adjacent. A notch starts with a convex vertex (e.g., $v_3$), goes through one or more concave vertices (e.g., $v_4$, $v_5$, and $v_6$), and ends with a convex vertex (e.g., $v_7$) along edges (and vertices) of the polygon (in one particular direction). Thus, a notch is formed when concave external angle(s) is (are) present for an (some) intersection line(s) of the object. Hence, the notch 204 is formed outside the polygon as shown in FIG. 2, below the dotted line connecting vertices $v_3$ and $v_7$, for example.

FIGS. 7a-e illustrate 2D views of example guard zones $G_1$ and $G_2$ of solid objects that each contain notches. Shapes of notches are reflected in the guard zones $G_1$ and $G_2$. Two or more solid objects may be accommodated in a minimum 3D space maintaining adjacency as well as safe separation distances using guard zone computations, and notches may further enable safe separation distances to be obtained. For example, for two guard zones $G_1$ and $G_2$, there are several possible 3D assignments of the objects, such as the example layouts illustrated in FIGS. 7b-e. One of the layouts may require a minimum amount of space, such as that shown in FIG. 7d, for example. In this example, the presence of notches enables such an assignment. Thus, guard zones of a set of 3D objects may be computed, and then objects can be allocated within a minimum 3D space using notches, for example.

Figure 8:
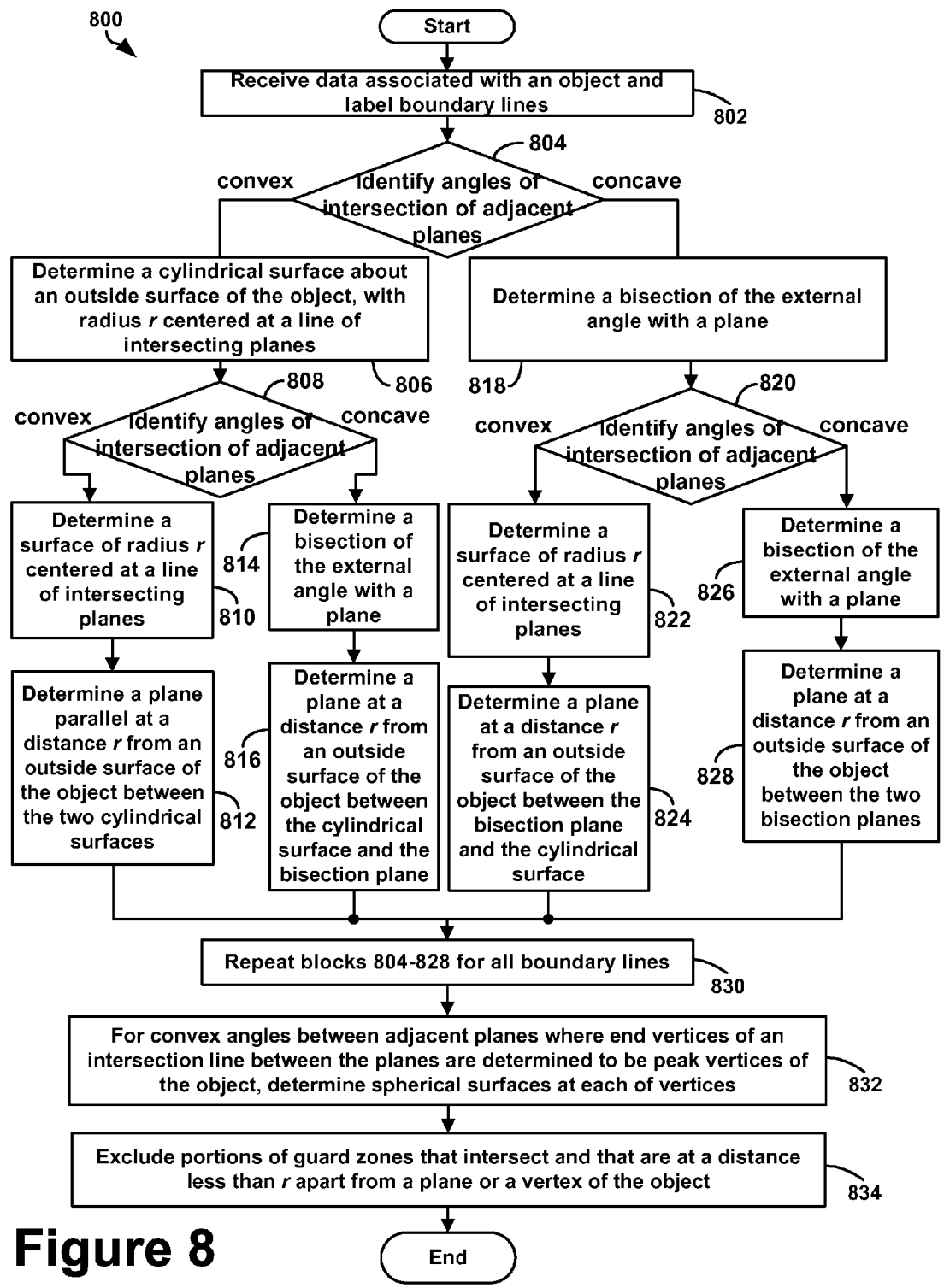
FIG. 8 shows a flowchart of an illustrative embodiment of a method for computing a 3D guard zone of an object.

FIG. 8 shows a flowchart of an illustrative embodiment of a method 800 for computing a 3D guard zone of an object. It should be understood that for this and other processes and methods disclosed herein, the flowchart shows functionality and operation of one possible implementation of present embodiments. In this regard, each block may represent a module, a segment, or a portion of program code, which may include one or more instructions executable by a processor for implementing specific logical functions, actions or steps in the method. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device.

In addition, each block in FIG. 8 may represent circuitry that can be wired to perform the specific logical functions in the process. Alternative implementations are included within the scope of the example embodiments of the present disclosure in which functions may be executed out of order from that shown or discussed, including substantially concurrent or in reverse order, depending on the functionality involved, as would be understood by those reasonably skilled in the art.

Method 800 may include one or more operations, functions or actions as illustrated by one or more of blocks 802, 804, 806, 808, 810, 812, 814, 816, 818, 820, 822, 824, 826, 828, 830, 832, and/or 834. Although the blocks are illustrated in a sequential order, these blocks may also be performed in parallel, and/or in a different order than those described herein. Also, the various blocks may be combined into fewer blocks, divided into additional blocks, and/or eliminated based upon the desired implementation.

Processing for method 800 may begin at block 802, "Receive data associated with an object and label boundary lines". For example, initially, data associated with an object (S) can be received into memory or by a processor, and all boundary lines (or lines of intersection of adjacent planes) can be labeled $l_1, l_2, \ldots, l_l$. The data, for example, may be comprised of values representative of the object such as a collection of one or more vertices, lines, shapes, lengths, radiuses, etc. Referring to FIG. 6, an example boundary line or line of intersection of adjacent planes is illustrated as line (po).

Block 802 may be followed by block 804, "Identify angles of intersection of adjacent planes". For example, for lines i=1 to l−1 (e.g., where the data includes l lines), an angle of intersection of adjacent planes can be identified as concave or convex. For example, equation (1) described above may be used by a processor to identify and/or categorize an angle as convex or concave.

When the angle is identified as convex, block 804 may be followed by block 806, "Determine a cylindrical surface about an outside surface of the object, with radius r centered at a line of intersecting planes". For example, for convex angles, a cylindrical surface can be determined about an outside surface of the object where a radius r of the cylindrical surface is centered at a line of the intersecting planes. Referring back to the illustration in FIG. 6, an example cylindrical surface q'-r'-r''-q'' can be computed and determined centering the intersection line q-r.

Block 806 may be followed by block 808, "Identify angles of intersection of adjacent planes". For example, the method 800 may continue to identify subsequent external angles of intersection of adjacent planes ($l_i, l_{i+1}$). The external angles can again be identified as concave or convex.

When the subsequent external angle is identified as convex, block 808 may be followed by block 810, "Determine a surface of radius r centered at a line of intersecting planes". If the angle is convex, for example, a cylindrical surface can be determined about an outside surface of the object of radius r centered at a line of the angle formed by adjacent planes.

Block 810 may be followed by block 812, "Determine a plane parallel at a distance r from an outside surface of the object between the two cylindrical surfaces". Thus, a plane can be drawn parallel to ($l_i, l_{i+1}$) at a distance r apart from an outside surface of the object that is a common tangent to both the cylindrical surfaces drawn at the lines $l_i$ and $l_{i+1}$ (e.g., as drawn in blocks 806 and 810). For example, a plane is drawn connecting the two cylindrical surfaces.

When the angle identified in block 808 is concave, block 808 may be followed by block 814, "Determine a bisection of the external angle with a plane". For concave angles, the external angle can be bisected with a plane. Referring back to the illustration in FIG. 6, a bisection plane is shown as points (o-p-u-v), for example. Incidentally, the bisection plane may not be formed or shown as part of the guard zone, but rather, used for computation of a portion of the guard zone.

Block 814 may be followed by block 816, "Determine a plane at a distance r from an outside surface of the object between the cylindrical surface and the bisection plane". For example, a plane is drawn parallel to ($l_i, l_{i+1}$) at a distance r apart from the object between the cylindrical surface and the bisection plane that is a tangent to the cylindrical surface drawn at $l_i$ and intersects the bisection plane. Thus, in this example, the bisection plane may be used as an endpoint for a portion of the guard zone that extends as a tangent of the cylindrical surface up to the bisection plane.

Returning to block 804, for a pair of intersecting adjacent planes forming a concave angle, block 804 may be followed by block 818 "Determine a bisection of the external angle with a plane". As described above, in some examples, the bisection plane may not be determined as part of the guard zone, but rather, used for computation of a portion of the guard zone.

Block 818 may be followed by block 820, "Identify angles of intersection of adjacent planes". For a subsequent external angle of intersection of adjacent planes ($l_i, l_{i+1}$), the external angle is identified as concave or convex.

When the subsequent angle is identified as convex, block 820 may be followed by block 822, "Determine a surface of radius r centered at a line of intersecting planes". If the angle is convex, a cylindrical surface is determined outside a surface of the object of radius r centered at a line of the angle, for example.

Block 822 may be followed by block 824, "Determine a plane at a distance r from an outside surface of the object between the bisection plane and the cylindrical surface". For example, a plane is then determined parallel to ($l_i, l_{i+1}$) at a distance r apart from a plane of the object (outside the object) that intersects the bisection plane and is a tangent to the cylindrical surface determined. The plane is a portion of the guard zone of the object.

When the subsequent angle can be identified as concave, block 820 may be followed by block 826, "Determine a bisection of the external angle with a plane". For example, if the angle is concave as determined by block 820, the external angle can be bisected with a plane (e.g., a second bisection plane), which may be used only for guard zone computation purposes.

Block 826 may be followed by block 828, "Determine a plane at a distance r from an outside surface of the object between the two bisection planes". For example, a plane is determined parallel to ($l_i, l_{i+1}$) at a distance r apart from a plane of the object (outside the object) that intersects the first and the second bisection planes. The plane is a portion of the guard zone of the object.

Blocks 804-812 illustrate and describe examples to compute portions of a guard zone for adjacent convex angles of intersection lines, blocks 804-808 and 814-816 illustrate and describe examples to compute portions of a guard zone for adjacent convex and concave angles of intersection lines, blocks 804 and 818-824 illustrate and describe examples to compute portions of a guard zone for adjacent concave and convex angles of intersection lines, and blocks 804, 818-820, and 826-828 illustrate and describe examples to compute portions of a guard zone for adjacent concave angles of intersection lines. Blocks 804-828 can be repeated for each of lines i=1 to l−1, as shown at block 830.

Block 830 may be followed by block 832, "For convex angles between adjacent planes where end vertices of an intersection line between the planes are determined to be peak vertices of the object, determine spherical surfaces at each of vertices". For example, for convex external angles between two adjacent planes of the object where two end vertices of an intersection line between the planes are u and v (that are two peak vertices of the solid object), spherical surfaces are drawn of radius r at each of vertices u and v separately, such that guard zonal planes associated to the vertices either become common tangents to the spherical surface(s) or intersect the spherical surfaces.

In one example, an input of a solid object (which is covered by a set of plane surfaces) is given by its peak vertices as (x, y, and z) coordinates (with respect to a 3D reference frame) and their adjacent coordinates. Two peak vertices of an object that are adjacent form an intersection line, and at least three intersection lines (based on adjacency of peak vertices) form a plane of the 3D object. As described, if the intersection line joining u and v forms an external angle convex, a cylindrical surface (outside the object) of radius r centering the line is determined; otherwise, the external angle along the intersection line joining u and v is bisected and each of the guard zonal planes determined for the associated planes adjacent to the intersection line joining u and v of the solid object would merge at the bisected plane (as each of the guard zonal planes computed for the planes of the object adjacent to the intersection line under consideration is at distance r apart from the plane). When vertices u and v are peak vertices, if the vertex is completely convex (e.g., each of the intersection lines ending at the peak vertex forms a convex external angle), then each of the guard zonal planes that are determined for the intersection line joining u and v would become a tangential plane to the spherical surface of radius r drawn at the peak. On the other hand, if such a peak vertex is partially convex (e.g., some of the intersection lines ending at the peak vertex form convex external angles whereas remaining lines form concave external angles), then adjacent guard zonal planes for a concave intersection line joining u and v would cut the spherical surface of radius r determined at the peak, for example.

Figure 9:
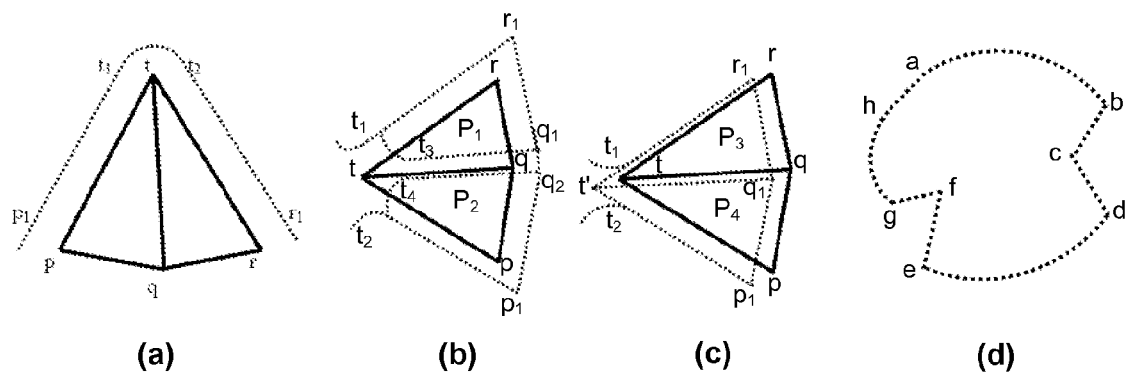
FIGS. 9a-d illustrate example planes with peak vertices for which spherical guard zones are formed.

FIGS. 9a-d illustrate example planes with peak vertices for which spherical guard zones are determined. FIGS. 9a-c illustrate an example of adjacent planes (tpq and tqr) of a 3D object with intersection lines tp, tq, tr, pq, and qr, where t is a peak vertex of the object, and vertex t is convex. In FIG. 9a, dotted lines show a guard zone for a portion of the object, and $t_1p_1$ ($t_2r_1$) is a line on a surface of the guard zone for intersection line tp (tr) of the object. Note that $t_1p_1$ ($t_2r_1$) is on a cylindrical surface of the guard zone if the intersection line tp (tr) forms an external convex angle; otherwise, $t_1p_1$ ($t_2r_1$) is on the guard zone as well as on a bisectional plane of the concave external angle formed by the planes adjacent to tp (tr). In addition, $t_1t_2$ is the guard zonal spherical surface due to the convex peak vertex t of the object. In FIG. 9b, in an example assuming that the intersection line tq forms an external convex angle, a cylindrical surface $t_3q_1q_2t_4$ is formed centering tq, and the guard zonal planes $P_1$ (i.e., $t_3q_1r_1t_1$) and $P_2$ (i.e., $t_4q_2p_1t_2$) are tangential to that surface. Moreover, $P_1$ and $P_2$ are also tangential to the spherical guard zonal surface $t_1t_3t_4t_2$ determined due to the peak vertex t (which is convex). In FIG. 9c, in an example assuming that the intersection line tq forms an external concave angle, the angle along tq is bisected, and on that bisectional plane t'$q_1$ is the line where the guard zonal planes $P_3$ and $P_4$ meet. In addition, $P_3$ (i.e., t'$r_1q_1$) and $P_4$ (i.e., t'$q_1p_1$) intersect the spherical guard zonal surface (due to t) along $t_1$t'$t_2$.

FIG. 9d illustrates an example cross-sectional view or top view of a spherical guard zone for a convex peak vertex of a 3D object. In this example, at least 11 planes and 11 intersection lines meet at the vertex of the object, out of which two pairs of adjacent planes form concave external angles. For example, there are three circular arcs in FIG. 9d including ab, de, and gh. Since this is a top view, each circular arc represents a cylindrical surface, where a cylindrical surface of the guard zone is obtained for two adjacent planes that form a convex external angle of the object. Each cross-section, bcd or efg, is obtained as a guard zonal part due to a concave external angle formed for two adjacent planes of the object. In addition, at least one more plane is present of the object for which guard zonal plane ah is determined, which is tangential to the spherical surface.

Referring back to FIG. 8, block 832 may be followed by block 834, "Exclude portions of guard zones that intersect and that are at a distance less than r apart from a plane or a vertex of the object". For example, if two planes, or a plane and a cylindrical/spherical surface, or two cylindrical/spherical surfaces of the guard zone intersect, portions of the plane(s) and/or the cylindrical/spherical surface(s) are excluded that are at a distance less than r apart from a plane or a vertex of the object (outside the object).

A time complexity of the method 800 of computing the guard zone is described below. A guard zone of an n-vertex, l-intersection line, and p-plane (or p-surface) convex object is a convex (3D) region with p planes (or surfaces), l cylindrical arcs, and n spherical surfaces, and n=O(l) and p=O(l). Planes of the guard zone are parallel to planes of the object at a distance r apart outside the object, and two adjacent planes of the guard zone can be joined by a cylindrical surface of radius r centered at the associated intersection line of the object. Spherical surfaces of radius r each are introduced as portions of the computed guard zone at vertices (or peaks) of the object where associated planes of the guard zone are tangent to the cylindrical as well as spherical surfaces, and the cylindrical portions of the guard zone also end with spherical surfaces of the guard zone near the vertices (or peaks) of the object. As a result, a time required to compute a three-dimensional guard zone of a convex solid object can be approximated as O(n+l+p)=O(l) since n and p are of the order of l (e.g., n=O(l) and p=O(l)).

For boundary lines $l_i$ and $l_{i+1}$ in succession of a plane that are intersection lines of the object, one of the lines (e.g., has already been considered for computing the guard zone of the adjacent plane in a prior iteration, and the other (e.g., $l_{i+1}$) is considered for a first time for computing the guard zone of the plane under consideration. For a plane of the object (whose guard zone is being computed) and an angle, either convex or concave, all computations take constant time. Therefore, for an object of n vertices, l intersection lines, and p planes, an overall worst-case time required to compute a guard zone of the object may be approximated as O(n+l+p)=O(l).

For a remainder of the method 800, for example, to exclude portions of the computed guard zone that are at a distance less than r apart from the planes, intersection lines, and vertices of the object for which segments of the guard zone are computed, this can be approximately realized in time O(l). For example, during computation of the guard zone for an intersection line and a plane, coordinates of points (e.g., x, y, z) can be identified inside the guard zone and outside the object in constant time. For visualization, for example, colors with specific intensity values may be used to indicate locations of coordinates. Alternatively, a flag can be set for coordinates and updated if the coordinates are included in a newly computed region of the guard zone for some other intersection line, for example.

As an aside, a lower bound of computing a guard zone of an object of n vertices, l intersection lines, and p planes may be approximately $\Omega$(n+l+p) or $\Omega$(l) since each of the components of the object is considered at least once. Within examples, a guard zone of an object of n vertices, l intersection lines, p planes may be computed in an asymptotic tight bound Θ(n+l+p) or Θ(l) time, which may be time-optimal, as the lower bound of computing a guard zone of a 3D solid object of n vertices, l intersection lines, and p planes is Ω(n+l+p) or Ω(l), and an upper bound to compute the guard zone is O(n+l+p) or O(l), for example.

In example embodiments, a guard zone of a 3D object can be computed using a sequential algorithm in which each portion of the object is considered sequentially. For example, a guard zone (of some component of the 3D object) may be computed using a sequential algorithm executed by one processor in constant time. A processor may compute a guard zone of one intersection line along with an adjacent plane, for example. Overall time complexity of the sequential algorithm may be about O(l), where l is the number of intersection lines of the 3D object.

In other examples, guard zones for 3D objects may be computed in parallel in which multiple portions of the objects are considered simultaneously. For example, rather than performing computation of the guard zone in a sequential manner using a single processor, as may be performed in one example using the method of FIG. 8, a guard zone of a 3D object with n vertices, l intersection lines, and p planes may be computed using multiple processors (e.g., O(l)) in a distributed computing environment.

Figure 10:
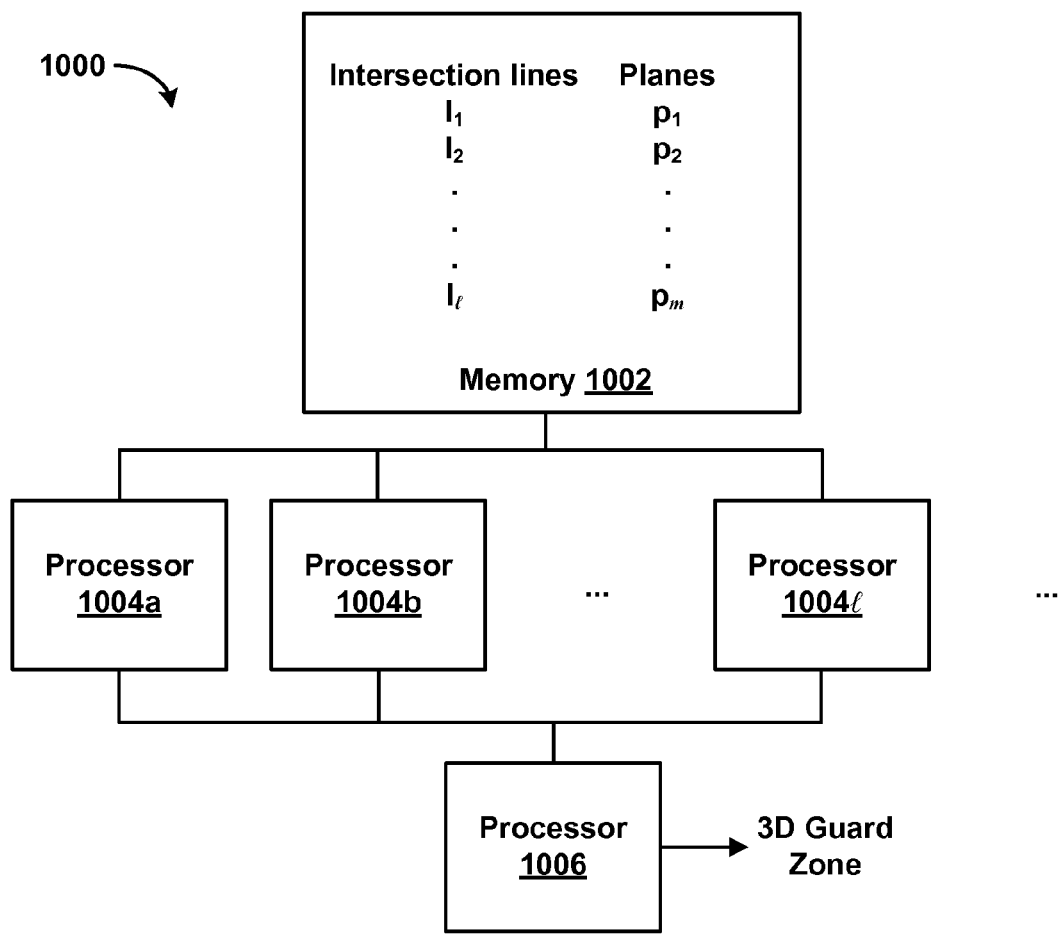
FIG. 10 is a block diagram illustrating an example system to compute a guard zone of a 3D object using parallel processing.
Figure 11:
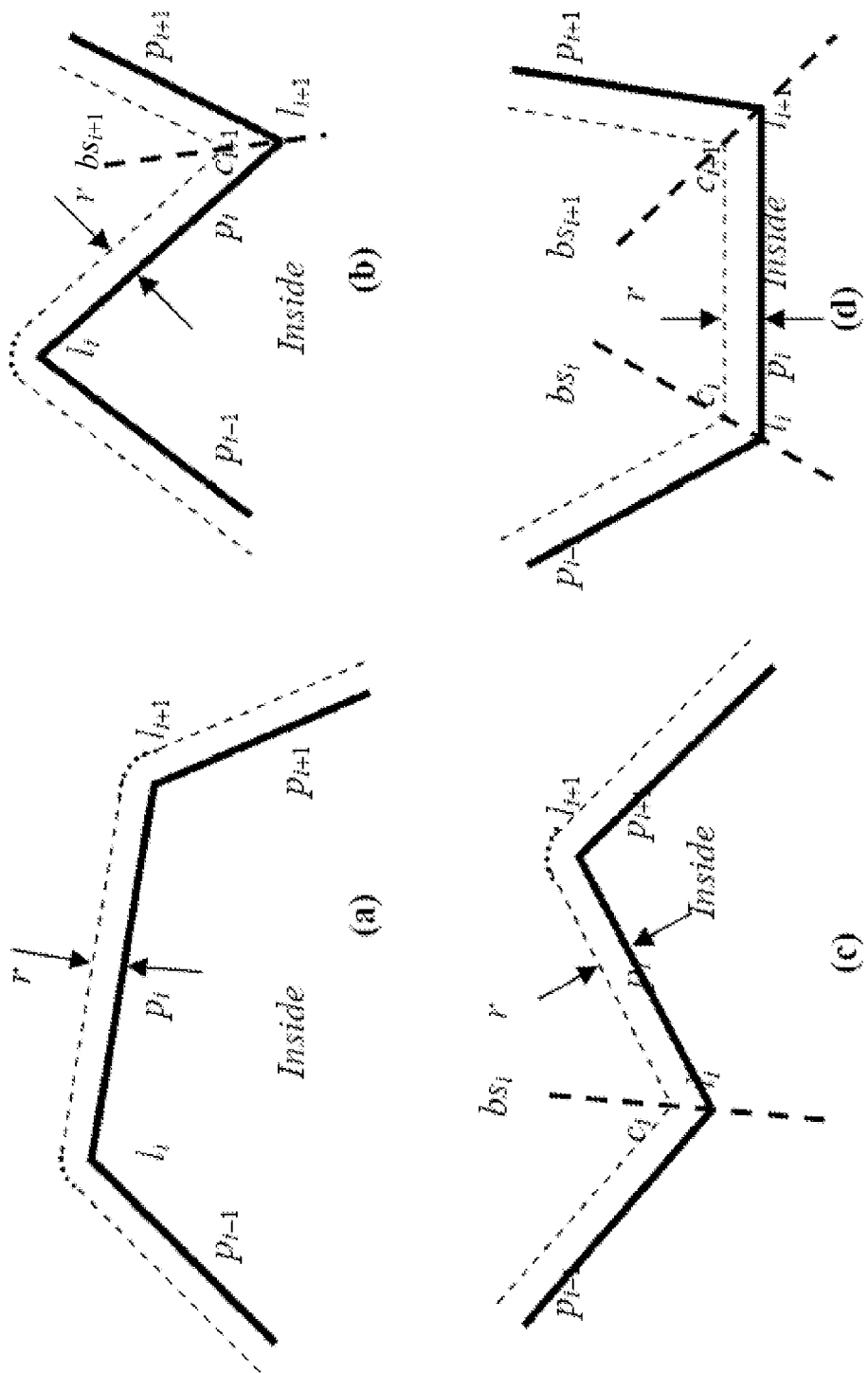
FIGS. 11a-d are four examples of 2D cross sections of portions of a 3D object (shown with solid lines), and portions of a guard zone (shown with dotted lines)

FIG. 10 is a block diagram illustrating an example system 1000 to compute a guard zone of a 3D object using parallel processing. The example system 1000 includes memory 1002, processors 1004a-1004l, and a processor 1006. The memory 1002 may be any form of computer readable media or computer readable storage media, for example. The processors 1004a-1004l and the processor 1006 may be any type of processor, such as for example, a microprocessor (μP), a microcontroller (μC), a digital signal processor (DSP), or any combination thereof.

Information or data associated with an object, such as l intersection lines $l_1 l_2, \ldots, l_l$ (which in a 3D view, consecutive intersection lines forming planes of the object) and m planes $p_1, p_2, \ldots, p_m$ are input into O(l) shared memory locations of a memory 1002. A number of processors equal to a number of intersection lines of the 3D object may be used. In this example, the system 1000 may include l processors (e.g., 1004a-1004l). Alternatively, as shown, the system 1000 may include more (or fewer) processors, and a number of processors equal to a number of lines of the 3D object may be used in the computation. The system 1000 may be a portion of or may comprise a distributed computing environment, for example.

A first processor 1004a can be configured to concurrently read the data associated with intersection line (e.g., the line between planes) and adjacent planes $p_{i-1}$ and $p_i$ (responsible for creating the intersection line $l_i$), and can be configured to compute or determine an external angle created at $l_i$. Processor 1004a can be adapted to consider one of four possible guard zone computations, and compute portions of a guard zone G for intersection line $l_i$ and plane $p_i$. FIGS. 11a-d are four examples of 2D cross-sections of portions of a 3D object (shown with solid lines), and portions of a guard zone (shown with dotted lines), determined in accordance with at least some techniques described herein.

In FIG. 11a, a plane $p_i$ has (both) end intersection lines $l_i$ and $l_{i+1}$ that have external convex angles. The processor 1004a can be configured to compute cylindrical surfaces (outside the object) of radius r centered at $l_i$ and $l_{i+1}$, and then compute a plane parallel to $p_i$ at a distance r apart from the plane of the object (and outside the object) that is a common tangent to both the cylindrical surfaces computed at band $l_i$ and $l_{i+1}$, and length same as ($l_i$, $l_{i+1}$) for a portion of the guard zone, for example.

In FIG. 11b, a plane $p_i$ has end Intersection lines $l_i$ that is convex and $l_{i+1}$ that have external concave angles. The processor 1004a can be configured to compute a cylindrical surface (outside the object) of radius r centered at $l_i$, and bisect the angle at $l_{i+1}$ and denote the bisection $bs_{i+1}$. Then the processor 1004a can be configured to compute a plane parallel to $p_i$ at a distance r apart from the plane of the solid object (and outside the solid object) that is a tangent to the cylindrical surface drawn at $l_i$ and intersects $bs_{i+1}$ at a line (e.g., as line $c_{i+1}$), for example.

In FIG. 11c, a plane $p_i$ has end intersection line $l_i$, at which the angle is concave, and line $l_{i+1}$, at which the angle is convex. The processor 1004a can be configured to bisect the angle at hand denote the bisection $bs_i$, and compute a cylindrical surface (outside the solid object) of radius r centered at $l_{i+1}$. Then the processor 1004a can be configured to compute a plane parallel to $p_i$ at a distance r apart from the plane of the object (and outside the object) that intersects or touches $bs_i$ at a line (e.g., line $c_i$), and is a tangent to the cylindrical surface computed at $l_{i+1}$, for example.

In FIG. 11d, a plane $p_i$ has (both) end intersection lines $l_i$ and $l_{i+1}$, at which the external angles are concave. The processor 1004a can be configured to bisect the angles at $l_i$ and $l_{i+1}$, and denote the bisections $bs_i$ and $bs_{i+1}$, respectively. Then the processor 1004a can be configured to compute a plane parallel to $p_i$ at a distance r apart from the plane of the object (and outside the object) that intersects or touches $bs_i$ at a line (e.g., line $c_i$) and $bs_{i+1}$ at a line (e.g., line $c_{i+1}$), if a distance from the intersection line of $bs_i$ and $bs_{i+1}$, to $p_i$ is more than r, for example.

Returning back to FIG. 10, the processor 1004a can be configured to consider one of the four possibilities as shown in FIGS. 11a-d, and compute portions of a guard zone G for intersection line $l_i$ and plane $p_i$. Each of the processors 1004a-pl can be adapted to receive information or data associated with respective adjacent intersection lines and adjacent planes (where each of the processors 1004a-l receives a different pair of intersection lines and adjacent planes), and compute portions of a guard zone G for the 3D object based on the example configurations shown in FIGS. 11a-d, for example.

Each of the processors 1004a-l may be adapted to output data associated with a computed portion of a 3D guard zone for the object to a processor 1006 (e.g., which may be an output processor). The processor 1006 may be configured to analyze the data associated with computed portions and exclude data relating to portions of plane segment(s) and/or cylindrical/spherical surface(s) of the computed guard zones that are at a distance less than r apart from a plane, an intersection line, or a vertex of the object if the plane segment(s) and/or cylindrical/spherical surface(s) of the guard zone intersect outside the solid object, for example. The processor 1006 may also be configured to combine data associated with the computed portions of the guard zone to generate a data set representing an entirety of the guard zone for the object, for example.

A time complexity of example algorithms described herein can be considered by using a concurrent read concurrent write (CRCW) parallel random access machine (PRAM) in a single instruction stream multiple data stream (SIMD) parallel computing environment where a control unit issues an instruction to be executed simultaneously (or substantially simultaneously) by all processors on respective data.

As described above with reference to FIG. 10, coordinates of l intersection lines of an object can be maintained in O(l) shared memory locations of a PRAM. Using a concurrent read (CR) instruction executed by O(l) processors, two or more processors can read from the same memory location at the same time. For example, data associated with the coordinates of intersection line $l_{i+2}$ can be accessed by processors $P_i$ through $P_{i+3}$. Thus, when instruction CR is executed, O(l) processors can be adapted to simultaneously read contents of O(l) memory locations such that processor $P_i$ reads the coordinates of intersection lines $l_{i-1}$, $l_i$, $l_{i+1}$, and $l_{i+2}$. This can also be executed using an exclusive read (ER) instruction by O(l) processors, where processors gain access to memory locations for the purpose of reading in a one-to-one fashion, for example. When an ER instruction is executed, O(l) processors simultaneously read contents of O(l) distinct memory locations such that each of the O(l) processors reads from one memory location and each of the O(l) memory locations involved is read by one processor. Note that CR includes ER in one example.

Then processor $P_i$ can be configured to compute planes $(l_{i-1}, l_i)$, $(l_i, l_{i+1})$, and $(l_{i+1}, l_{i+2})$ (i.e., $p_{i-1}$, $p_i$, and $p_{i+1}$, respectively), and to compute external angles at Intersection lines hand Processor $P_i$ may be adapted to determine one of the four possible guard zones, as described in FIG. 11a-d. Accordingly, the processor can be configured to compute cylindrical surface(s), if the angle(s) is (are) convex and/or bisects the angle(s) if the angle(s) is (are) concave. In addition, the processor can be configured to compute a plane parallel to $p_i$ at a distance r apart from the plane of the object (and outside the object), as a portion of the guard zone G being computed.

Hence, a guard zone for an object may be computed in constant time, which may contain several redundant portions of (overlapping) planes and/or cylindrical/spherical surfaces due to presence of notch(es). To remove undesired portions of G, a concurrent write (CW) instruction in the form of a combined sum CW by O(l) processors can be executed, and two or more processors can write into the same memory location at the same time with a resulting sum of data remaining in the memory location, for example. For example, for a CW instruction, all the values that a set of processors may write simultaneously into a memory location are combined into a single value, which is then stored in that location. A CW instruction may take several forms depending on which function is being used to combine the values (written by several processors) before storing the result (in the memory location). In some of these forms, the values to be written can be combined using arithmetic functions, such as SUM (added up) or PRODUCT (multiplied), or a set of Boolean values can be combined using logical functions such as AND, OR, or EX-OR, or the largest or smallest of the values to be written can be selected using selection functions such as MAX and MIN, respectively, etc., for example. In one example, processor $P_i$ may be responsible for computing a guard zone for an intersection line $l_i$ along with its plane $p_i$ of the 3D object. Similarly, all l processors perform tasks simultaneously. Hence, following the instruction of combined sum CW, a complete guard zone of the 3D object is computed as data that would result in the location of the memory.

Moreover, when a CW instruction is executed, O(l) processors can simultaneously (or substantially simultaneously) write into one memory location. To exclude the portions of G that are at a distance less than r apart from a plane of the solid object or an intersection line (outside the solid object), processor $P_i$ may set a value of a flag for a region (for which the processor is responsible), inside G and outside the object, to be one. Then a CW instruction, as stated above, is executed by O(l) processors, over the regions inside G and outside the object, that are computed simultaneously by all the processors, and written into the (l+1)th shared memory location of the PRAM. Some regions of the guard zone (i.e., inside G and outside S) may have the flag incremented (e.g., the flag may be two or more) if the regions overlap. To illustrate, a color C with intensity I can be used to differentiate a region of G from the solid object, and after summing the l distinct portions of the computed guard zone (that are written into the (l+1)th shared memory location of the PRAM), the overlapped region may have a color C with an intensity other than I, for example.

Figure 12A:
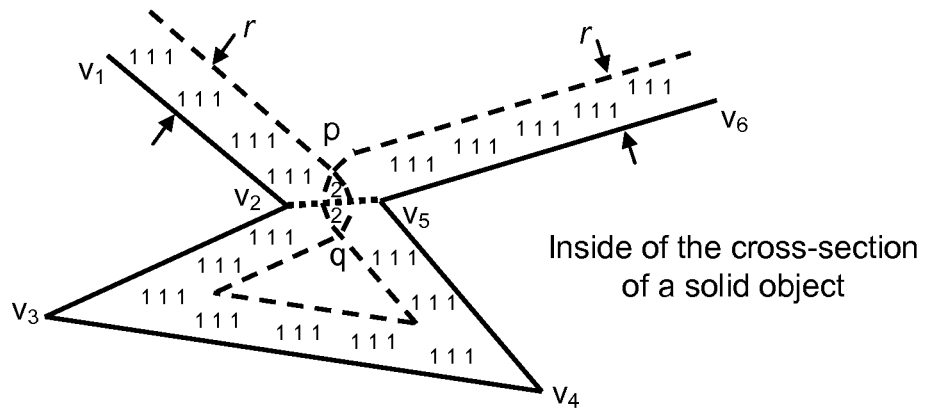
FIGS. 12a-b illustrate an example cross-section of a 3D object (shown with solid lines) with a guard zone (shown with dotted lines)
Figure 12B:
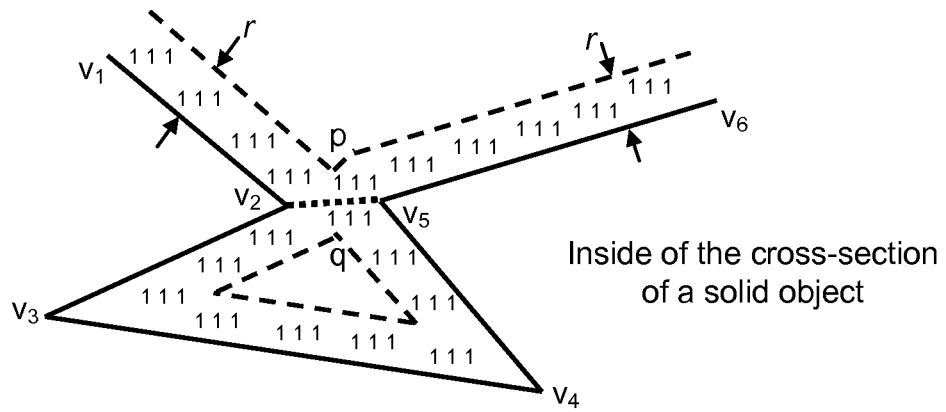

FIGS. 12a-b illustrate an example cross-section of a 3D object (shown with solid lines) with a guard zone (shown with dotted lines). A notch is formed between vertices $v_2$ and $v_5$ of the 3D object whose corresponding intersection lines $l_2$ and $l_5$ (passing through vertices $v_2$ and $v_5$, respectively) are at a distance less than 2r, and a guard zone (shown with dotted lines) is obtained for this notch. It may be noted that processor $P_i$ may compute a guard zone for the intersection line $l_i$ along with its plane $p_i$ of the 3D object and place a flag one (1) inside the guard zone and outside the solid object. Here, as the distance between $v_2$ and $v_5$ is less than 2r, the guard zones for the portions $v_1$-$v_2$-$v_3$ and $v_6$-$v_5$-$v_4$ intersect (or cross) at points p and q (in their 2D view). Hence after execution of the instruction combined sum CW by all the processors simultaneously, the flag within the overlap region (pq) is incremented to two (2), whereas the flag outside the overlap region (pq) remains one (1). As shown in FIG. 12b, after exclusion of the guard zone within the overlap region (pq) excepting theirs points of intersection (i.e., apart from points p and q), the desired guard zone for this portion of the 3D object is computed (that may contain a hole), where the flags outside the object and inside the guard zone are all one (1), for example. It may be noted that a color C with intensity I (instead of flag 1) and the same color C with an intensity other than I (instead of flag 2), can be used for example.

To exclude boundaries of regions with a flag value other than one (or a color C with an intensity other than I), all the processors can be adapted to execute a CR instruction. For example, all the O(l) processors may be configured to concurrently read content of the (l+1)th shared memory location of the PRAM, which is now the guard zone as a whole that may contain some redundant portions. Each of the processors can be configured to read the information (i.e., coordinates) about the specified region inside G and outside the object that are flagged either one or more. Processor $P_i$ excludes a portion data associated with G, other than the ith portion, for which the processor is responsible. Processor $P_i$ can be configured to verify whether the region inside G (and outside the object), computed by the processor $P_i$, contains any coordinate with a flag other than one. If no region is found, the processor $P_i$ takes no action. Otherwise, $P_i$ can be configured to exclude the portion data associated with G (computed by the processor $P_i$), whose coordinates have a flag other than one. This may also be computed in constant time, for example.

A CW instruction may be executed to write modified portions of the guard zone computed by all the processors concurrently to the (l+1)th shared memory location of the PRAM. Hence, a guard zone G computed for a solid object S is available at the (l+1)th location of the shared memory.

In one example, a running time of methods described herein is approximately O(1). As O(l) processors are involved in computing a guard zone, the method may be cost-optimal. A guard zone of a solid object with l intersection lines among adjacent planes can be computed in constant time, for example.

Figure 13:
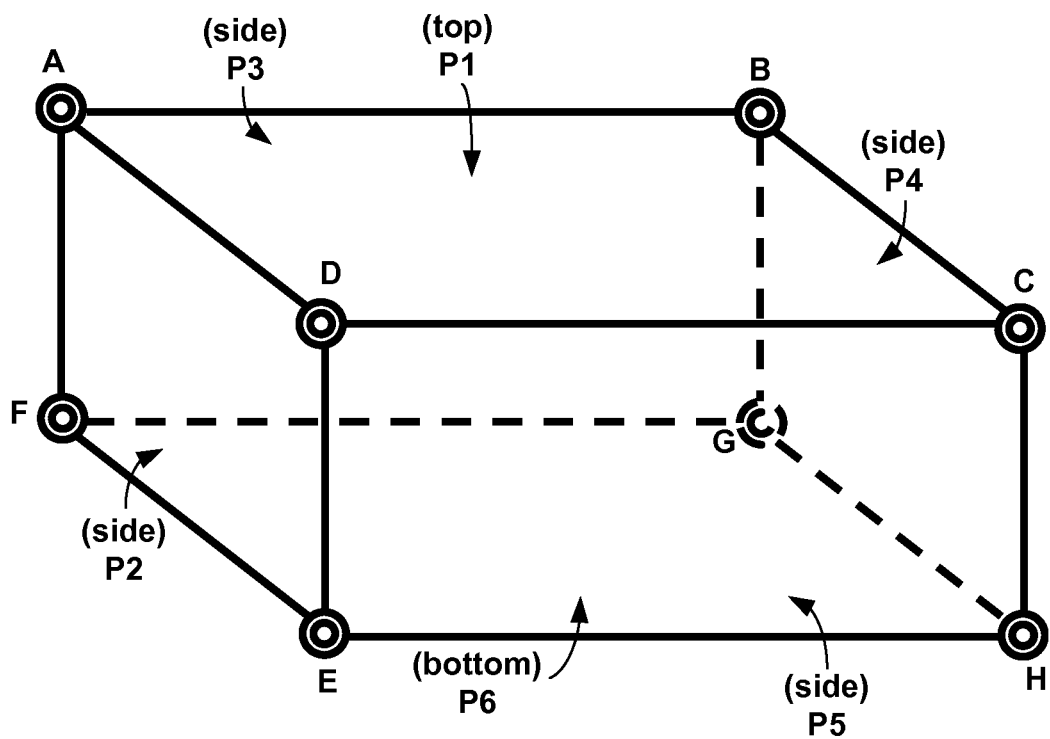
FIG. 13 illustrates an example 3D object.

FIGS. 13-16 illustrate an example of computing a guard zone of an object using parallel processing, in accordance with various techniques disclosed herein. FIG. 13 illustrates an example 3D object. The object includes eight peak vertices A through H, a set of 12 (convex) intersection lines (AB, AD, AF, BC, BC, BG, CD, CH, DE, EF, EH, FG, GH), and six (rectangular) planes P1<ABCD>, P2<ADEF>, P3<ABGF>, P4<BCHG>, P5<CDEH>, and P6<EFGH>, where plane pairs <P1,P6>, <P2,P4>, and <P3,P5> are parallel (and identical) to each other.

Figures 14, 15, 16:
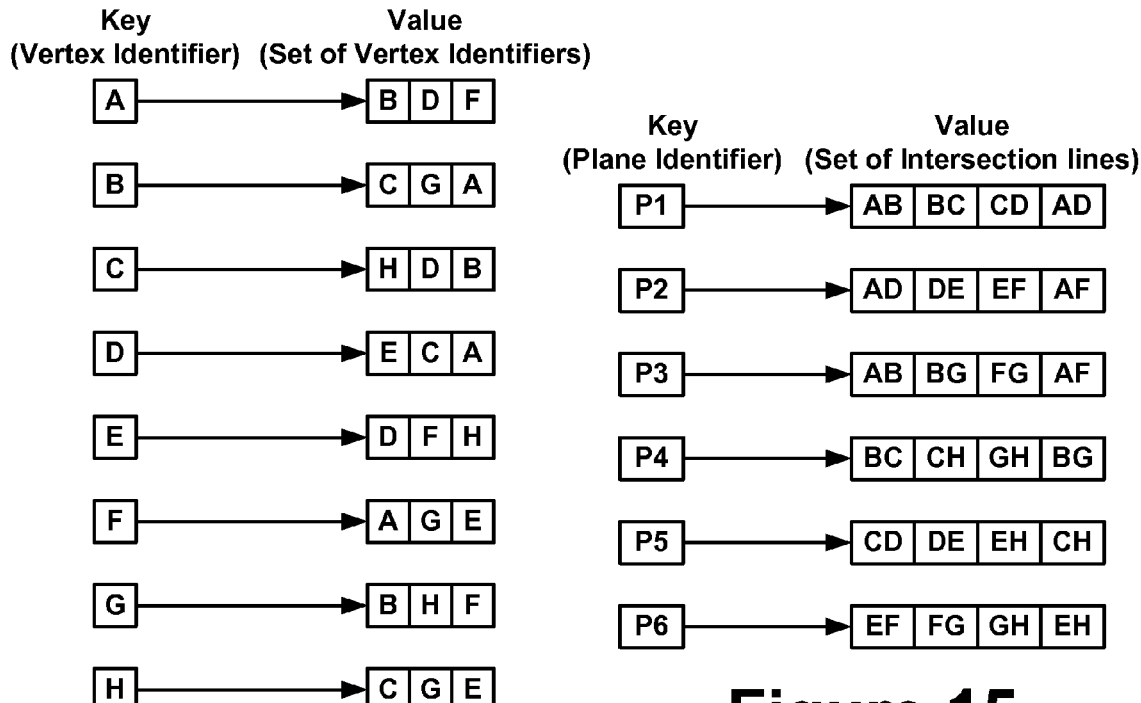
FIG. 14 illustrates an example hash map for the example 3D object in FIG. 13.
FIG. 15 illustrates an example hash map whose key is a plane identifier (e.g., P1 through P6) and a value is a reference to a set containing intersection lines that constitute the allied plane, as shown in FIG. 13.
FIG. 16 is a table including plane identifiers connecting to intersection lines along with angle information external to the object.

To compute a guard zone of the 3D object in FIG. 13, data associated with coordinates of peak vertices of the 3D solid object (i.e., A through H) along with neighboring information may be received as an input at a system (e.g., into memory or received by processors). The neighboring information may be stored in a hash map, whose key is a vertex identifier and a value is a reference to a set containing neighboring vertex identifiers. FIG. 14 illustrates an example hash map for the example 3D object in FIG. 13. Mapping provides information relating to vertex adjacency. A left column of FIG. 14 comprises a vertex identifier (as key value) corresponding to each of the peak vertices of the object, and a right column includes peak vertices that are adjacent to a specified key (peak vertex) through intersection lines.

An output of the system is a set of objects, and each object may include the following three parameters: an intersection line, two planes adjacent to the intersection line, and an external angle (either concave or convex) between the two planes along the intersection line.

To provide the output, individual vertex coordinates and neighboring information are processed to identify a set of intersection lines that constitute a plane. For the example in FIG. 13, a data structure such as that in FIG. 15 for example, can be constructed. FIG. 15 illustrates an example hash map whose key is a plane identifier (e.g., P1 through P6) and a value is a reference to a set containing intersection lines that constitute the allied plane, as shown in FIG. 13. Thus, FIG. 15 is a hash map for the 3D object shown in FIG. 13 that includes information relating to intersection lines that are adjacent to a plane. A left column comprises a plane identifier (as key value) corresponding to each of the planes of the object, and a right column includes a set of intersection lines (as values) involving a plane.

Next, the hash map in FIG. 15 can be processed to identify planes associated to a particular intersection line. From the hash map in FIG. 15, an intersection line can be linked to two adjacent planes that could be identified (e.g., in FIG. 15, the intersection line AB is present in two different sets of intersection lines whose plane identifiers are P1 and P3).

A set of objects is constructed that may contain the following information: an intersection line (e.g., AB), two plane identifiers (e.g., P1 and P3 that are adjacent to AB), and a type of the external angle formed between two adjacent planes along the intersection line (e.g., concave or convex). For example, according to FIGS. 14 and 15, the set of objects that is produced may be that as shown in the Table in FIG. 16, for example. FIG. 16 is a table including plane identifiers connecting to intersection lines along with angle information external to the object. The plane identifiers involve related intersection lines along with the (external) angle information, either concave or convex, as meta-data for example.

Following, individual elements of intersection lines, as shown in the Table in FIG. 16, are processed and guard zones of respective portions of the (3D) object may be constructed.

Using example embodiments described herein, guard zones may be computed to enable layout of components in a VLSI design. Circuit components (or functional units/modules or groups/blocks of different sub-circuits) may be specified to be placed at certain distances from each other to avoid electrical hazards (or parasitic effects) among the components. Circuit components on a chip may be viewed as a set of solid objects in a three-dimensional space. Each circuit component (Ci) can be associated with a parameter $\delta i$ such that a minimum clearing zone of width $\delta i$ is to be maintained around Ci. Spacing required to accommodate the circuit components may be, in general, isothetic three-dimensional objects. A location of a guard zone (of specified width) for a solid object can be used to resize circuit components in designing 3D VLSI circuits, for example.

As one example, in a hierarchy of a block level design of a 3D VLSI chip, k modules ($B_1, B_2, \ldots, B_k$) may be placed, and each $B_i$ may be considered an object that requires a distance $r_i$, $1 \le i \le k$, from each of the remaining blocks $B_j, j \ne i$. An objective may be to compute a minimum 3D arrangement of all k blocks, and if $B_i$ and $B_j$ are placed adjacent, then every pair of points on a surface of these two blocks (one on the surface of $B_i$ and the other on the surface of $B_j$) may be in a minimum separation of $\max(r_i, r_j)$, or $r_i + r_j$, as the case may be. To achieve interconnections among subcircuits, blocks can be alienated (or separated) further, but not adjusted below a minimum parting as stated above. Guard zone computation can be used to determine a layout of the blocks to achieve a desired packing density and/or efficient layout of 3D circuits, for example.

In some examples, a guard zone (or safety zone) may not be computed at every possible point or cross-section of a 3D solid object. Rather, points or cross-sections along the 3D object may be selected to achieve an approximation of a guard zone (via interpolation) along each cross-section of the object, for example.

In example embodiments, a 3D region (or space; guard zone) of width r outside an object may be computed. In other examples, a 3D region (or space; guard zone) of width r inside the object may be computed. For example, a 3D object may not be solid, but rather, may be or include hollow portions with a thickness d. Thus, a guard zone outside as well as inside the object can be computed. To compute a guard zone inside an object, example methods described herein can be performed. Note that if an external angle along an intersection line of a 3D object is convex (concave), then an internal angle (along the intersection line) is concave (convex).

Figure 17:
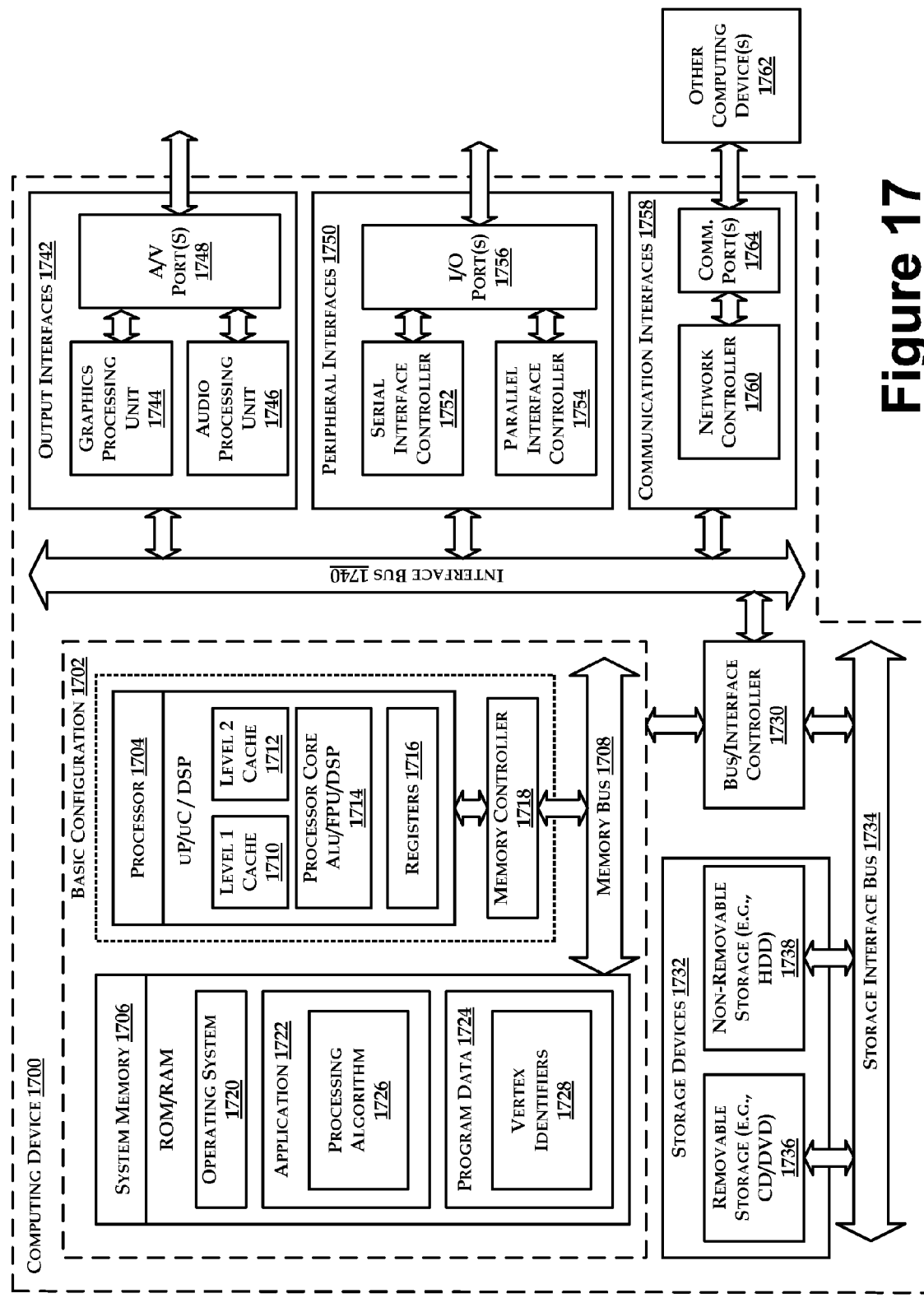
FIG. 17 is a block diagram illustrating an example computing device arranged for computing guard zones of an object.

FIG. 17 is a block diagram illustrating an example computing device 1700 arranged for computing guard zones of an object. In a very basic configuration 1702, computing device 1700 typically includes one or more processors 1704 and system memory 1706. A memory bus 1708 can be used for communicating between the processor 1704 and the system memory 1706.

Depending on the desired configuration, processor 1704 can be of any type including but not limited to a microprocessor (μP), a microcontroller (μC), a digital signal processor (DSP), or any combination thereof Processor 1704 can include one more levels of caching, such as a level one cache 1710 and a level two cache 1712, a processor core 1714, and registers 1716. The processor core 1714 can include an arithmetic logic unit (ALU), a floating point unit (FPU), a digital signal processing core (DSP Core), or any combination thereof. A memory controller 1718 can also be used with the processor 1704, or in some implementations the memory controller 1718 can be an internal part of the processor 1704.

Depending on the desired configuration, the system memory 1706 can be of any type including but not limited to volatile memory (such as RAM), non-volatile memory (such as ROM, flash memory, etc.) or any combination thereof.

System memory 1706 typically includes an operating system 1720, one or more applications 1722, and program data 1724. Application 1722 includes algorithms 1726 that may be arranged to perform any of the methods described herein, for example, depending on a configuration of the computing device 1700. Program Data 1724 includes values 1728 corresponding to vertex locations or identifiers, for example. In some example embodiments, application 1722 can be arranged to operate with program data 1724 on the operating system 1720. This described basic configuration is illustrated in FIG. 17 by those components within dashed line 1702.

Computing device 1700 can have additional features or functionality, and additional interfaces to facilitate communications between the basic configuration 1702 and any required devices and interfaces. For example, a bus/interface controller 1730 can be used to facilitate communications between the basic configuration 1702 and one or more data storage devices 1732 via a storage interface bus 1734. The data storage devices 1732 can be removable storage devices 1736, non-removable storage devices 1738, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media can include volatile and nonvolatile, removable and non-removable media implemented in any method or technology for storage of information, such as computer readable instructions, data structures, program modules, or other data.

System memory 1706, removable storage 1736, and non-removable storage 1738 are all examples of computer storage media. Computer storage media (or computer readable storage media) includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 1700. Any such computer storage media can be part of device 1700.

Computing device 1700 can also include an interface bus 1740 for facilitating communication from various interface devices (e.g., output interfaces, peripheral interfaces, and communication interfaces) to the basic configuration 1702 via the bus/interface controller 1730. Example output interfaces 1742 include a graphics processing unit 1744 and an audio processing unit 1746, which can be configured to communicate to various external devices such as a display or speakers via one or more A/V ports 1748. Example peripheral interfaces 1750 include a serial interface controller 1752 or a parallel interface controller 1754, which can be configured to communicate with external devices such as input devices (e.g., keyboard, mouse, pen, voice input device, touch input device, etc.) or other peripheral devices (e.g., printer, scanner, etc.) via one or more I/O ports 1756. An example communication interface 1758 includes a network controller 1760, which can be arranged to facilitate communications with one or more other computing devices 1762 over a network communication via one or more communication ports 1764. The communication connection is one example of a communication media. Communication media may typically be embodied by computer readable instructions, data structures, program modules, or other data in a modulated data signal, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media.

Computing device 1700, and/or portions of computing device, can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 1700 can also be implemented as a personal computer including both laptop computer and non-laptop computer configurations.

FIG. 18 is a schematic illustrating a conceptual partial view of an example computer program product 1800 that includes a computer program for executing a computer process on a computing device, arranged according to at least some embodiments presented herein. An illustrative embodiment of the example computer program product 1800 is provided using a signal bearing medium 1802. The signal bearing medium 1802 may include one or more programming instructions 1804 that, when executed by, for example, a processor, may provide functionality or portions of the functionality described above with respect to FIGS. 1-17. Thus, for example, referring to flow diagram 800, one or more features of blocks 802, 804, 806, 808, 810, 812, 814, 816, 818, 820, 822, 824, 826, 828, 830, 832 and/or 834 of FIG. 8 may be undertaken by one or more instructions associated with the signal bearing medium 1802.

In some examples, the signal bearing medium 1802 may encompass a computer-readable medium 1806, such as, but not limited to, a hard disk drive, a Compact Disc (CD), a Digital Video Disk (DVD), a digital tape, memory, etc. In some implementations, the signal bearing medium 1802 may encompass a computer recordable medium 1808, such as, but not limited to, memory, read/write (R/W) CDs, R/W DVDs, etc. In some implementations, the signal bearing medium 1802 may encompass a communications medium 1810, such as, but not limited to, a digital and/or an analog communication medium (e.g., a fiber optic cable, a waveguide, a wired communications link, a wireless communication link, etc.). Thus, for example, the signal bearing medium 1802 may be conveyed by a wireless form of the communications medium 1810 (e.g., a wireless communications medium conforming with the IEEE 802.11 standard).

The one or more programming instructions 1804 may be, for example, computer executable and/or logic implemented instructions. In some examples, a computing device such as computing device 1700 of FIG. 17 may be configured to provide various operations, functions, or actions in response to the programming instructions 1804 conveyed to the computing device 1700 by one or more of the computer readable medium 1806, the computer recordable medium 1808, and/or the communications medium 1810.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to", etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone. A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B".

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third, and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A system configured to compute one or more three-dimensional guard zones associated with a corresponding object, the system comprising:
    a memory including a shared memory location configured to store information associated with an object, the information including coordinates of vertices and planes associated with the object;
    a plurality of processors, each of the plurality of processors configured to:
        receive from the memory respective information associated with adjacent planes, wherein each of the plurality of processors is configured to receive information associated with a different pair of adjacent planes;
        compute an external angle created between the adjacent planes, and based on the external angle, determine a first guard zone component for a line between the adjacent planes and for one of the planes adjacent to the line;
        set a flag for the first guard zone component;
        write the first guard zone component to the shared memory location;
        determine whether the first guard zone component overlaps with a second guard zone component in the shared memory location;
        increment the flag for a region of the first guard zone component in response to determination that the region overlaps with the second guard zone component; and
    an output processor configured to receive information associated with the first and second guard zone components, and configured to determine a three-dimensional guard zone associated with the object by combination of information associated with the first and second guard zone components.

2. The system of claim 1, wherein the plurality of processors and the output processor are associated with a single multi-core processor.

3. The system of claim 1, wherein the plurality of processors are configured to receive from the memory information associated with respective adjacent planes using a concurrent read instruction.

4. The system of claim 1, wherein the first guard zone component for the line between the adjacent planes is determined to be a cylindrical surface about an outside surface of the object with a radius centered at the line between the adjacent planes when the external angle at the line between the adjacent planes is convex.

5. The system of claim 1, wherein the first guard zone component for the line between the adjacent planes is determined to be a plane parallel to the object and at a distance from the object that intersects a plane that bisects the external angle when the external angle at the line between the adjacent planes is concave.

6. The system of claim 1, wherein the output processor is configured to exclude a portion of a given guard zone component from the three-dimensional guard zone associated with the object, where the excluded portion is at a distance less than a predefined distance from the object.

7. The system of claim 1, wherein the plurality of processors are configured to:
read content of the shared memory location of the memory that includes the first and second guard zone components; and
exclude the region of a respective guard zone component when the flag for the region of the respective guard zone component has been incremented so as to create a modified guard zone component.

8. The system of claim 7, wherein the plurality of processors are each further configured to write the modified guard zone component to the shared memory location.

9. The system of claim 1, wherein the plurality of processors are each configured to categorize the external angle between the adjacent planes as convex when the external angle between the adjacent planes is greater than about 180°.

10. The system of claim 1, wherein the plurality of processors are each configured to categorize the external angle between the adjacent planes as concave when the external angle between the adjacent planes is less than about 180°.

11. The system of claim 1, wherein the output processor is configured to identify notches in the object, wherein a notch is a polygonal region outside a surface of the object that starts with a first convex external angle between adjacent planes, goes through one or more concave external angle(s) between adjacent planes, and ends with a second convex external angle between adjacent planes.

12. The system of claim 1, wherein the plurality of processors and the output processor are associated with a single multi-core processor and the single multi-core processor is configured to receive from the memory information associated with respective adjacent planes using a read instruction.

13. A system configured to compute one or more three-dimensional guard zones associated with a corresponding object, the system comprising:
a memory configured to store information associated with an object, where the information includes coordinates of vertices and planes associated with the object;
a processor configured in communication with the memory;
wherein the processor is effective to:
receive from the memory respective information associated with adjacent planes,
compute an external angle created between the adjacent planes;
determine a first guard zone component for a line between the adjacent planes and for one of the planes adjacent to the line based on the external angle;
set a flag for the first guard zone component;
write the first guard zone component to the memory;
determine whether the first guard zone component overlaps with a second guard zone component in the memory; and
increment the flag for a region of the first guard zone component when the region is determined to overlap with the second guard zone component.

14. The system of claim 13, wherein the processor is further effective to determine a three-dimensional guard zone associated with the object by combination of information associated with two or more guard zone components.

15. The system of claim 13, wherein the processor is configured to:
read content of the memory that includes the first and second guard zone components; and
exclude the region of a respective guard zone component in response to the flag for the region of the respective guard zone component having been incremented so as to create a modified guard zone component.

16. The system of claim 13, wherein the first guard zone component for the line between the adjacent planes is determined to be a cylindrical surface about an outside surface of the object with a radius centered at the line between the adjacent planes in response to the external angle at the line between the adjacent planes being convex.

17. The system of claim 13, wherein the first guard zone component for the line between the adjacent planes is determined to be a plane parallel to the object and at a distance from the object that intersects a plane that bisects the external angle in response to the external angle at the line between the adjacent planes being concave.

18. A system configured to compute one or more three-dimensional guard zones associated with a corresponding object, the system comprising:
a memory configured to store information associated with first and second objects, where the information includes coordinates of vertices and planes associated with the first object and the second object;
a plurality of processors, each of the plurality of the processors is effective to:
receive from the memory respective information associated with a first set of adjacent planes associated with the first object;
receive from the memory respective information associated with a second set of adjacent planes associated with the second object;
compute a first external angle created between the first set of adjacent planes and, based on the first external angle, determine a first guard zone component for a line between the first set of adjacent planes and for one of the planes adjacent to the line;
compute a second external angle created between the second set of adjacent planes and, based on the second external angle, determine a second guard zone component for a line between the second set of adjacent planes and for one of the planes adjacent to the line;
an output processor configured to:
receive information associated with the first and second guard zone components from each of the plurality of processors;
determine a first three-dimensional guard zone associated with the first object by combination of information associated with the first guard zone component from each of the plurality of processors;

determine a second three-dimensional guard zone associated with the second object by combination of information associated with the second guard zone component from each of the plurality of processors;

identify notches in the first and second objects; and compute an arrangement of the first object and the second object such that each of the first object and the second object is at a minimum separation distance between each other using the first three-dimensional guard zone, the second three dimensional guard zone, and the notches.

19. The system of claim 18, wherein a notch is a polygonal region outside a surface of the object that starts with a first convex external angle between adjacent planes, goes through one or more concave external angle(s) between adjacent planes, and ends with a second convex external angle between adjacent planes.

* * * * *

UNITED STATES PATENT AND TRADEMARK OFFICE
CERTIFICATE OF CORRECTION

PATENT NO. : 8,640,068 B2
APPLICATION NO. : 13/497477
DATED : January 28, 2014
INVENTOR(S) : Pal et al.

It is certified that error appears in the above-identified patent and that said Letters Patent is hereby corrected as shown below:

Title Page

On Page 2, in item (56), under "OTHER PUBLICATIONS", in Column 1, Line 7, delete "6.3.2.:" and insert -- 6.3.2: --, therefor.

On Page 2, in item (56), under "OTHER PUBLICATIONS", in Column 2, Line 22, delete "Proc.of" and insert -- Proc. of --, therefor.

In the Specification

In Column 4, Line 44, delete "segments)" and insert -- segment(s) --, therefor.

In Column 9, Line 44, delete "($l_i$, $l_{i+1}$)." and insert -- ($l_i$, $l_{i+1}$). --, therefor.

In Column 11, Line 3, delete "rat" and insert -- r at --, therefor.

In Column 12, Line 38, delete "(e.g.," and insert -- (e.g., $l_i$) --, therefor.

In Column 13, Line 38, delete "$l_1 l_2$," and insert -- $l_1$, $l_2$, --, therefor.

In Column 13, Line 51, delete "intersection line" and insert -- intersection line $l_i$ --, therefor.

In Column 14, Line 1, delete "band $l_i$" and insert -- $l_i$ --, therefor.

In Column 14, Line 4, delete "Intersection" and insert -- intersection --, therefor.

In Column 14, Line 18, delete "hand" and insert -- $l_i$ and --, therefor.

Signed and Sealed this
Third Day of June, 2014

Michelle K. Lee
*Deputy Director of the United States Patent and Trademark Office*

CERTIFICATE OF CORRECTION (continued)
U.S. Pat. No. 8,640,068 B2

In Column 14, Line 39, delete "1004apl" and insert -- 1004a-l --, therefor.

In Column 15, Lines 23-24, delete "Intersection lines hand" and insert -- intersection lines $l_i$ and $l_{i+1}$. --, therefor.

In Column 16, Line 58, delete "zone" and insert -- zone G --, therefor.

In Column 17, Line 6, delete "BC, BC," and insert -- BC, --, therefor.

In Column 18, Line 55, delete "thereof" and insert -- thereof. --, therefor.